United States Patent
Kii et al.

(10) Patent No.: US 6,744,402 B2
(45) Date of Patent: Jun. 1, 2004

(54) HIGH-FREQUENCY DIODE OSCILLATOR AND MILLIMETER-WAVE TRANSMITTING/RECEIVING APPARATUS

(75) Inventors: Hironori Kii, Soraku-gun (JP); Nobuki Hiramatsu, Soraku-gun (JP); Toshihiko Kawata, Soraku-gun (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/630,484

(22) Filed: Jul. 29, 2003

(65) Prior Publication Data

US 2004/0017262 A1 Jan. 29, 2004

Related U.S. Application Data

(62) Division of application No. 09/645,100, filed on Aug. 23, 2000, now Pat. No. 6,630,870.

(30) Foreign Application Priority Data

| Aug. 24, 1999 | (JP) | ......... P11-237318 |
| Sep. 14, 1999 | (JP) | ......... P11-260597 |
| Sep. 20, 1999 | (JP) | ......... P11-266195 |
| Nov. 18, 1999 | (JP) | ......... P11-328290 |
| Jun. 27, 2000 | (JP) | ......... P2000-193382 |

(51) Int. Cl.$^7$ ............................ G01S 13/00
(52) U.S. Cl. ............ 342/200; 342/202; 331/96; 331/107 G; 331/107 SL; 331/185
(58) Field of Search ............... 331/67, 68, 96, 331/107 SL, 107 G, 175, 185; 332/106, 117, 129, 130, 135, 136; 342/175, 200–204; 455/73, 77, 84–87

(56) References Cited

U.S. PATENT DOCUMENTS

| 3,918,009 A | 11/1975 | Claxton et al. |
| 5,394,154 A | 2/1995 | Uematsu et al. |
| 6,630,870 B1 * | 10/2003 | Kii et al. ............ 331/96 |

FOREIGN PATENT DOCUMENTS

| JP | 6-177649 | 6/1994 |
| JP | 6-177650 | 6/1994 |
| JP | 6-188633 | 7/1994 |
| JP | 6-268447 | 9/1994 |
| JP | 8-307113 | 11/1996 |
| JP | 8-307155 | 11/1996 |

OTHER PUBLICATIONS

Kuroki, et al., "60 GHz NRD–Guide *Gunn Oscillator*", Technical Report of IEICE. EMCJ92–54, MW92–94, The Institute of Electronics, Information and Communication Engineers, Oct. 1992, Japan, pp. 85–90.

* cited by examiner

*Primary Examiner*—David Mis
(74) *Attorney, Agent, or Firm*—Hogan & Hartson

(57) ABSTRACT

An object of the present invention is to facilitate positioning of a metal member for mounting a high-frequency diode and of a dielectric strip, thereby remarkably improving control of oscillation characteristics and workability in production. The invention provides a Gunn diode oscillator comprising, between parallel plate conductors disposed at an interval equal to or less than one half of wavelength $\lambda$ of high-frequency signals, a metal member provided with a Gunn diode device which oscillates high-frequency signals, a choke-type bias supply strip which is made by alternately forming wide strips and narrow strips and which supplies a bias voltage to the Gunn diode device, and a strip conductor which linearly connects the choke-type bias supply strip and the Gunn diode device, and further comprising, in the vicinity of the Gunn diode device, a dielectric strip which is disposed in the vicinity of the Gunn diode device and which receives and propagates high-frequency signals, wherein the cycles of the wide strips and narrow strips of the choke-type bias supply strip are set to approximately $\lambda/4$, respectively, and the length of the strip conductor is set to approximately $\{(\frac{3}{4})+n\}\lambda$ (n is an integer of 0 or more).

4 Claims, 28 Drawing Sheets

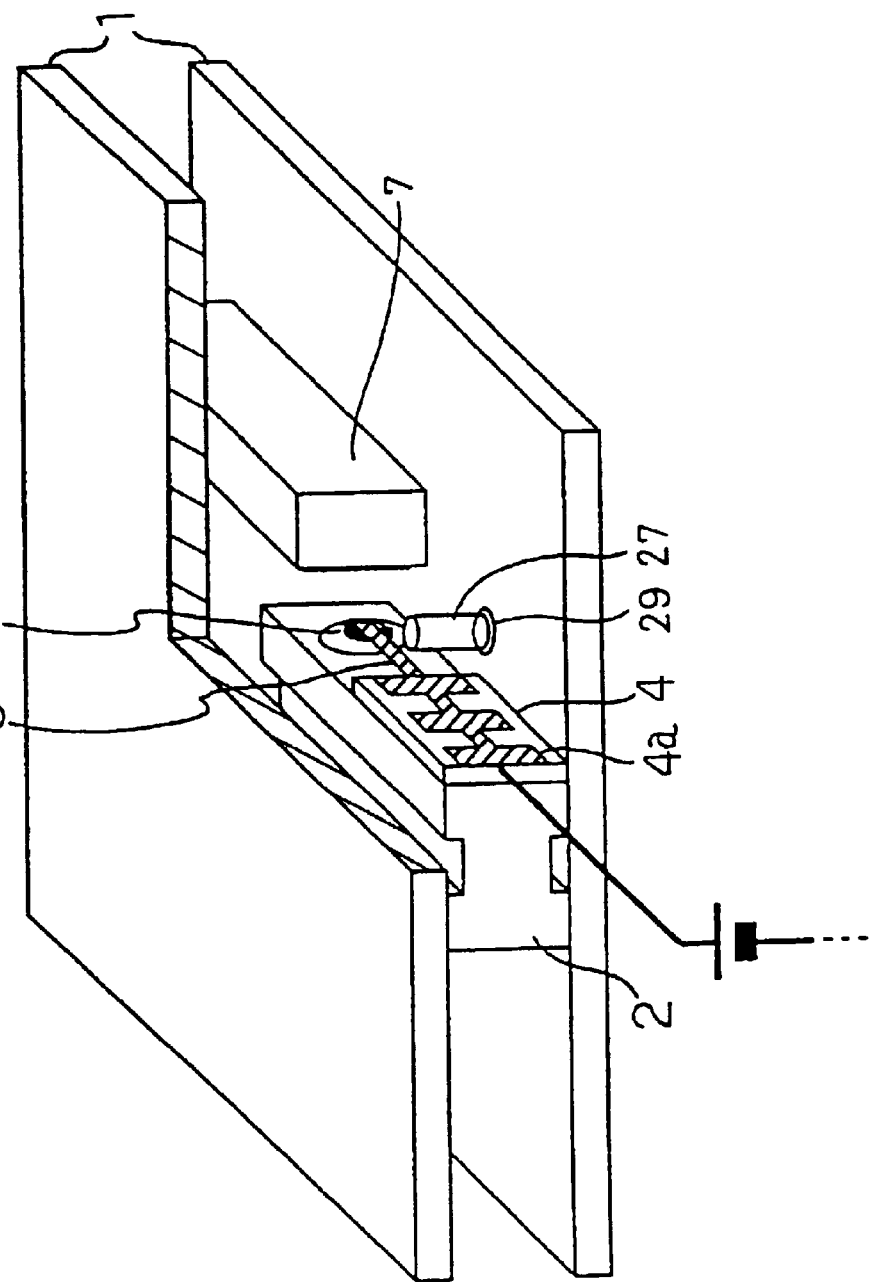

IN PROXIMATE STATE

IN JOINT STATE

HIGH-FREQUENCY DIODE OSCILLATOR AND MILLIMETER-WAVE TRANSMITTING/RECEIVING APPARATUS

This is a divisional of application Ser. No. 09/645,100 filed Aug. 23, 2000, which now U.S. Pat. No. 6,301,870, application is hereby incorporate by reference in its entirety.

BACKGROUND OF THE INVENTION

1. Field of the Invention

The present invention relates to a high-frequency diode oscillator which is a high-frequency oscillator such as a Gunn diode oscillator built in, for example, a high-frequency circuit such as a millimeter-wave integrated circuit and in which a nonradiative dielectric waveguide is used, and also relates to a millimeter-wave transmitting/receiving apparatus equipped with this high-frequency diode oscillator.

2. Description of the Related Art

A conventional Gunn diode oscillator is shown in FIG. 31. In FIG. 31, reference numeral 201 denotes a pair of parallel plate conductors. By setting an interval z between the conductors to $z \leq \lambda/2$, a so-called nonradiative dielectric waveguide (referred to as an NRD guide, hereafter) is configured, which prevents noise from entering from outside into a dielectric strip 207 and prevents high-frequency signals from radiating outside, thereby transmitting signals. Herein, $\lambda$ represents the wavelength of an electromagnetic wave (high-frequency signal) which propagates in the air at a used frequency.

Further, reference numeral 202 denotes a nearly rectangular parallelepiped metal member such as a metal block for mounting a Gunn diode device, reference numeral 203 denotes a Gunn diode device which is a kind of microwave diodes for oscillating microwaves, reference numeral 204 denotes a wiring board which is mounted on one side surface of the metal member 202 and which is provided with a choke-type bias supply strip 204a for supplying a bias voltage to the Gunn diode device 203 and functioning as a low-pass filter for preventing leakage of high-frequency signals, reference numeral 205 denotes a strip conductor such as a metal foil ribbon which connects the choke-type bias supply strip 204a and the upper conductor of the Gunn diode device 203, reference numeral 206 denotes a metal strip resonator which is made by disposing a resonating metal strip line 206a to a dielectric base, and reference numeral 207 denotes a dielectric strip which transmits high-frequency signals resonated by the metal strip resonator 206 to the outside. In FIG. 31, the upper one of the parallel plate conductors 201 is partially cut away in order to show the interior thereof.

In the NRD guide type of Gunn diode oscillator of FIG. 31, the metal member 202 mounted with the Gunn diode device 203 is disposed between the pair of parallel plate conductors 201. High-frequency signals (electromagnetic waves) such as microwaves oscillated from the Gunn diode device 203 are led out to the dielectric strip 207 via the metal strip resonator 206 having the metal strip line 206a.

Then, in the choke-type bias supply strip 204a, a choke in which the spatial cycle (length of one) of wide strips and the spatial cycle (length of one) of narrow strips are repeated by a cycle of approximately $\lambda/4$, respectively, is formed as shown in FIG. 32. Further, the length of the strip conductor 205 is also set to approximately $\lambda/4$, and the strip conductor 205 functions as part of a low-pass filter.

However, the conventional Gunn diode oscillator is configured so that the metal strip resonator 206, the metal member 202 for mounting the Gunn diode device 203, and the dielectric strip 207 are registered individually and interposed between the parallel plate conductors 201, 201. For this reason, the position of the metal strip resonator 206 varies due to vibration and its weight in the case where the processing accuracy of the metal strip resonator 206 is low, and propagation characteristics to the dielectric strip 207 is deteriorated in the case where the resonator is not accurately registered. That is to say, the conventional Gunn diode oscillator has a problem that the processing accuracy and positioning accuracy of the metal strip resonator 206 need to be controlled, workability in production is bad, and therefore the oscillator is not suitable for mass production.

In FIGS. 31 and 32, the strip 204a of the wiring board 204 is diagonally shaded so that the configuration is clearly shown. This in true in other drawings attached to the specification of this application.

FIG. 33 is a partially cutaway view in perspective of another prior art. This prior art of FIG. 33 is similar to the prior art as shown in FIGS. 31 and 32, and like elements will be denoted by like reference numerals. A dielectric strip 207 disposed in the vicinity of a Gunn diode 203 has a function of receiving high-frequency signals and propagating outside. A strip conductor 205 is spanned between a choke-type bias supply strip 204a and the Gunn diode 203, spaced at a predetermined interval from the surface of a metal member 202. A square-pole-like dielectric chip 309 is disposed close to a strip conductor 205 to be electromagnetically connected thereto, whereby it is made possible to control the oscillation frequency of high-frequency signals.

The prior art as shown in FIG. 33 also has the same problem as the prior art as shown in FIGS. 31 and 32.

FIG. 34 is a partially cutaway view in perspective of still another prior art, and FIG. 35 is a perspective view showing the configuration of part of the prior art as shown in FIG. 34. This prior art as shown in FIGS. 34 and 35 is similar to the prior art as shown in FIGS. 31–33, and like elements will be denoted by like reference numerals. In specific, in the prior art of FIGS. 34 and 35, a wiring board 208 provided with a varactor diode 210 which is a frequency modulating diode and a kind of variable capacitance diode is mounted on a mid-portion of a dielectric strip 207. A bias voltage applying direction B of the varactor diode 210 is set to a direction which is perpendicular to a propagation direction D of high-frequency signals in the dielectric strip 207 and parallel to the main surfaces of parallel plate conductors 201. The bias voltage applying direction B coincides with an electric field direction E of $LSM_{01}$ mode of high-frequency signals which propagate in the dielectric strip 207. With this, by electromagnetically coupling high-frequency signals and the varactor diode 210 and controlling a bias voltage to change the capacitance of the varactor diode 210, it is possible to control the oscillation frequency of high-frequency signals. Further, reference numeral 209 denotes a dielectric plate with high relative dielectric constant for matching the impedance of the varactor diode 210 and that of the dielectric strip 207, In FIG. 34, the upper one of the parallel plate conductors 201 is partially cut away in order to show the interior thereof.

Further, as shown in FIG. 35, a second choke-type bias supply strip 212 is formed on one main surface of the wiring board 208, and a beam lead type of varactor diode 210 is disposed on a mid-portion of the second choke-type bias supply strip 212. At a connecting portion of the second choke-type bias supply strip 212 to the varactor diode 210, an electrode 211 is formed.

Then, high-frequency signals oscillated from a Gunn diode 203 are led out to the dielectric strip 207 through a metal strip resonator 206. Subsequently, the high-frequency signals are partially reflected at the varactor diode 210, and return toward the Gunn diode 203. As the reflection signals change together with the capacitance of the varactor diode 210, the oscillation frequency changes.

In the choke-type bias supply strip 204a, wide strips and narrow strips are alternately formed to construct a choke in which the length of one wide strip and the length of one narrow strip are approximately $\lambda/4$, respectively. Further, the length of a strip conductor 205 is also set to approximately $\lambda/4$, and the strip conductor 205 functions as part of a low-pass filter.

However, this conventional Gunn diode oscillator is configured so that high-frequency signals pass through the wiring board 208 mounted with the varactor diode 210, and therefore has such a problem that the output of high-frequency signals decreases. Further, although it is necessary to change the insertion position of the varactor diode 210 in order to regulate the frequency modulation width of high-frequency signals, it is difficult to control the frequency modulation width by regulating the position. Therefore, the frequency modulation width cannot be controlled with ease.

SUMMARY

Therefore, the present invention was completed in view of the above circumstances, and an object of the invention is to provide a high-frequency diode oscillator in which difficulty in processing and positioning of parts can be lowered, namely, processing accuracy and positioning accuracy can be easily controlled, and excellent workability in production and assembly can be achieved.

The invention was completed in view of the above circumstances, and another object of the invention is to provide a downsized high-frequency diode oscillator in which by disposing a frequency regulating member made of a dielectric or metal so that fine adjustment of position is carried out with ease and high reproducibility, fine-regulation of oscillation frequency can be achieved with high reproducibility, and the fine adjustment of position can be achieved by downsizing the frequency regulating member.

The invention was completed in view of the above circumstances, and still another object of the invention is to provide a high-frequency diode oscillator in which high-power high-frequency signals can be obtained and control of frequency modulation width can be carried out with ease.

Still another object of the invention is to provide a millimeter-wave transmitting/receiving apparatus equipped with a high-frequency diode oscillator in the above mentioned objects are achieved.

The invention provides a high-frequency diode oscillator comprising:
a metal member which is disposed between parallel plate conductors disposed at an interval equal to or less than one half of wavelength $\lambda$ of a high-frequency signal, the metal member being provided with a high-frequency diode which oscillates a high-frequency signal,
a choke-type bias supply strip comprising wide strips and narrow strips which are alternately arranged, and
a strip conductor for linearly connecting the choke-type bias supply strip to the high-frequency diode; and
a dielectric strip for receiving and propagating the high-frequency signal, which is disposed in a vicinity of the high-frequency diode between the parallel plate conductors, length of the strip conductor being set to approximately $\{(3/4)+n\}\lambda$ (n represents an integer of 0 or more), and length of the wide strips and narrow strips of the choke-type bias supply strip being set to approximately $\lambda/4$.

In the high-frequency diode oscillator of the invention it is preferable that a dielectric chip having a main surface opposed to a main surface of the strip conductor is disposed in proximity to the strip conductor to be electromagnetically coupled thereto.

In the high-frequency diode oscillator of the invention it is preferable that length of the strip conductor is within a range of approximately $3/4$ to approximately $\{(3/4)+3\}\lambda$.

In the high-frequency diode oscillator of the invention it is preferable that length of the strip conductor is within a range of $\{(3/4)+n\}\lambda \pm 20\%$.

In the high-frequency diode oscillator of the invention it is preferable that the choke-type bias supply strip and the strip conductor are made of Cu, Al, Au, Ag, W, Ti, Ni, Cr, Pd or Pt.

In the high-frequency diode oscillator of the invention it is preferable that the dielectric strip and the dielectric chip are made of cordierite ceramics or alumina ceramics.

In the high-frequency diode oscillator of the invention it is preferable that an interval between the main surface of the dielectric chip and the main surface of the strip conductor is in a range of 0.1 to 1.0 mm.

According to the invention, with such configurations, the choke-type bias supply strip and the strip conductor function as a resonator which determines the oscillation frequency of the high-frequency diode, so that an extra resonator such as a metal strip resonator is unnecessary. Therefore, the metal member for mounting the high-frequency diode and the dielectric strip is easily positioned, whereby workability in production is largely improved. Further, the invention has such an effect that a loss due to a separate resonator such as a metal strip resonator is avoided and excellent propagation characteristics of high-frequency signals can be obtained.

According to the invention, it is preferable that a dielectric strip having a main surface opposed to a main surface of the strip conductor is disposed in proximity to the strip conductor to be electromagnetically coupled thereto. With this, regulation of oscillation frequency of the high-frequency diode oscillator is further facilitated, and mass-productivity is further increased.

According to the invention, the cycle of the wide strips and narrow strips of the choke-type bias supply strip is set to approximately $\lambda/4$ and the length of the strip conductor is set to approximately $\{(3/4)+n\}\lambda$ (n represents an integer of 0 or more). With this, the choke-type bias supply strip and the strip conductor function as a resonator which determines the oscillation frequency of the high-frequency diode, so that an extra resonator such as a metal strip resonator is unnecessary. Therefore, positioning of the metal member for mounting the high-frequency diode and the dielectric strip is remarkably facilitated, whereby oscillation characteristics are controlled and increased with ease, and workability in production is largely increased. Further, the invention has such an effect that a loss due to a separate resonator such as a metal strip resonator is avoided and improved propagation characteristics of high-frequency signals are obtained.

In the high-frequency diode oscillator of the invention it is preferable that the metal member has a hole formed at a position corresponding to the strip conductor, and a column-like frequency regulating member which is inserted into the hole and disposed in proximity to the strip conductor so that an end thereof protrudes from a surface of the metal member.

In the high-frequency diode oscillator of the invention it is preferable that the frequency regulating member is made of cordierite ceramics, alumina ceramics, Cu, Al, Fe or stainless steel.

In the high-frequency diode oscillator of the invention it is preferable that an interval between the frequency regulating member and the strip conductor is in a range of 0.05 to 0.10 mm.

In the high-frequency diode oscillator of the invention it is preferable that an area of an end surface of the frequency regulating member opposed to the strip conductor is in a range of 0.10 to 2.0 mm$^2$.

According to the invention, with such configurations, the choke-type bias supply strip and the strip conductor function as a resonator which determines the oscillation frequency of the high-frequency diode. When the frequency regulating member is disposed in proximity to the strip conductor of the resonator to be electromagnetically coupled thereto, the position of the frequency regulating member can be finely regulated with ease and reproducibility. Therefore, the invention has such an effect that the substantial resonator length of the resonator can be finely regulated and, as a result, the oscillation frequency can be finely regulated with reproducibility. Further, by downsizing the frequency regulating member and enabling fine regulation of the position, the high-frequency diode oscillator is downsized as a whole.

According to the invention, the cycles of the wide strips and narrow strips of the choke-type bias supply strip are set to approximately $\lambda/4$, respectively, the length of the strip conductor is set to approximately $\{(\frac{3}{4})+n\}\lambda$ (n represents an integer of 0 or more), and the metal member has a hole formed at a position corresponding to the strip conductor and a column-like frequency regulating member inserted into the hole and disposed in proximity to the strip conductor so that the end thereof protrudes from the surface of the metal member. With this, the choke-type bias supply strip and the strip conductor function as a resonator which determines the oscillation frequency of the high-frequency diode. When the frequency regulating member is disposed in proximity to the strip conductor of the resonator to be electromagnetically coupled thereto, the position of the frequency regulating member can be finely regulated with ease and reproducibility. Therefore, the substantial resonator length of the resonator can be finely regulated and, as a result, the oscillation frequency can be finely regulated with reproducibility. Further, by downsizing the frequency regulating member and enabling fine regulation of the position, the high-frequency diode oscillator is downsized as a whole.

In the high-frequency diode oscillator of the invention it is preferable that a frequency modulating diode whose bias voltage applying direction is set to a direction parallel to an electric field generated at the strip conductor is disposed in proximity to the strip conductor to be electromagnetically coupled thereto.

According to the invention, with such a configuration, the choke-type bias supply strip and the strip conductor function as a resonator which determines the oscillation frequency of the high-frequency diode. By disposing a modulation circuit board provided with the frequency modulating diode, in proximity to the strip conductor of the resonator to be electromagnetically coupled with the strip conductor, and changing a bias voltage applied to the frequency modulating diode, it is possible to control the oscillation frequency. Further, since there is no need to place a frequency modulating diode in the dielectric strip, it is possible to obtain a high output with low loss and downsize the oscillator as a whole. Furthermore, by regulating the position of the frequency modulating diode, it is possible to change the strength of electromagnetic coupling between the strip conductor which also functions as a resonator and the frequency modulating diode, and thereby regulate the frequency modulation width.

According to the invention, the lengths of the wide strips and narrow strips of the choke-type bias supply strip are set to approximately $\lambda/4$, respectively, the length of the strip conductor is set to approximately $\{(\frac{3}{4})+n\}\lambda$ (n represents an integer of 0 or more), and a frequency modulating diode whose bias voltage applying direction is set to a direction parallel to an electric field generated at the strip conductor is disposed in proximity to the strip conductor to be electromagnetically coupled thereto. With this, the choke-type bias supply strip and the strip conductor function as a resonator which determines the oscillation frequency of the high-frequency diode. By disposing a modulation circuit board provided with the frequency modulating diode, in proximity to the strip conductor of the resonator to be electromagnetically coupled thereto, and changing a bias voltage applied to the frequency modulating diode, it is possible to control the oscillation frequency. Further, since there is no need to dispose a frequency modulating diode in the dielectric strip as in the case of a conventional oscillator, it is possible to obtain a high output with low loss and downsize the oscillator as a whole. Furthermore, by regulating the position of the frequency modulating diode, it is possible to change the strength of electromagnetic coupling between the strip conductor and the frequency modulating diode, and thereby regulate the frequency modulation width.

In the high-frequency diode oscillator of the invention it is preferable that the frequency modulating diode is mounted on a modulation circuit board composed of a wiring board having a main surface perpendicular to the parallel plate conductors on which main surface a second choke-type bias supply strip is formed, and an auxiliary board which stands on a mid-portion of the second choke-type bias supply strip and has a main surface on which a connection conductor connected to the second choke-type bias supply strip is formed, and the frequency modulating diode is connected to a mid-portion of the connection conductor on the auxiliary board.

In the high-frequency diode oscillator of the invention it is preferable that an interval between the frequency modulating diode and the strip conductor is set to the wavelength $\lambda$ or less.

In the high-frequency diode oscillator of the invention it is preferable that a position of the frequency modulating diode with respect to the strip conductor is within a range of one quarter the length of the strip conductor toward the high-frequency diode or choke-type bias supply strip from a center of the strip conductor.

According to the invention, preferably the frequency modulating diode is mounted on a modulation circuit board composed of a wiring board having the main surface perpendicular to the parallel plate conductors, on which main surface a second choke-type bias supply strip is formed, and an auxiliary board which stands on the mid-portion of the second choke-type bias supply strip and has the main surface on which a connection conductor connected to the second choke-type bias supply strip is formed, and the frequency modulating diode is connected to the mid-portion of the connection conductor on the auxiliary board. With this, the shape of the modulation circuit board seen from the top becomes a convex, so that displacement, twist or the like is decreased and stability in mounting is remarkably improved. Further, since it is possible to displace the frequency modulating diode in proximity to the strip conductor and regulate the position thereof in a state where a bias voltage applying direction of the frequency modulating diode coincides with an electric field direction of high-frequency signals, it is possible to regulate the frequency modulation width with ease.

With the above configuration, the shape of the modulation circuit board seen from the top becomes a convex, so that displacement, twist or the like is decreased and stability of mount is exceedingly increased. Further, since it is possible to dispose the frequency modulating diode in proximity to the strip conductor and regulate the position thereof in a state where a bias voltage applying direction of the frequency modulating diode coincides with an electric field direction of high-frequency signals, it is possible to regulate the frequency modulation width with ease.

Further, it is preferable that the interval between the frequency modulating diode and the strip conductor is set to the wavelength $\lambda$ or less. By regulating the interval within the above range, it is possible to increase the output of high-frequency signals and broaden the frequency modulation width.

In the high-frequency diode oscillator of the invention it is preferable that a through hole is formed in the vicinity of the strip conductor on at least one of the parallel plate conductors, and a column-like frequency regulating member which is protruded from a surface of one of the parallel plate conductors which surface confronts a surface of the other of the parallel plate conductors to be electromagnetically coupled thereto is disposed in the through hole.

In the high-frequency diode oscillator of the invention it is preferable that a distance between the frequency regulating member and the strip conductor is one half of the wavelength $\lambda$ or less.

In the high-frequency diode oscillator of the invention it is preferable that a shape of the protrusion of the frequency regulating member is tapered.

In the high-frequency diode oscillator of the invention it is preferable that the frequency regulating member is made of cordierite ceramics, alumina ceramics, Cu, Al, Fe or stainless steel.

In the high-frequency diode oscillator of the invention it is preferable that an area of a surface of the frequency regulating member opposed to the strip conductor is in a range of 0.5 to 3.0 mm$^2$.

According to the invention, with such configurations, the choke-type bias supply strip and the strip conductor function as a resonator which determines the oscillation frequency of the high-frequency diode. When the frequency regulating member is disposed in proximity to the strip conductor of the resonator to be electromagnetically coupled to the conductor, the position of the frequency regulating member can be finely regulated with ease and reproducibility. Therefore, the invention has such an effect that the substantial resonator length of the resonator can be finely regulated and, as a result, the oscillation frequency can be finely regulated with reproducibility. Further, by downsizing the frequency regulating member and enabling fine regulation of the position, the high-frequency diode oscillator is downsized as a whole.

According to the invention, in the NRD guide type of high-frequency diode oscillator, the lengths of the wide strips and narrow strips of the choke-type bias supply strip are set to approximately $\lambda/4$, respectively, the length of the strip conductor is set to approximately $\{(\frac{3}{4})+n\}\lambda$ (n represents an integer of 0 or more), a through hole is formed in the vicinity of the strip conductor on at least one of the parallel plate conductors, and a column-like frequency regulating member which is protruded from a surface of one of the parallel plate conductors which surface confronts a surface of the other of the parallel plate conductors to be electromagnetically coupled thereto is disposed in the through hole. With this, the choke-type bias supply strip and the strip conductor function as a resonator which determines the oscillation frequency of the high-frequency diode. When the frequency regulating member is disposed in proximity to the strip conductor of the resonator to be electromagnetically coupled thereto, the position of the frequency regulating member can be finely regulated with ease and reproducibility. Therefore, the substantial resonator length of the resonator can be finely regulated and, as a result, the oscillation frequency can be finely regulated with reproducibility. Further, by downsizing the frequency regulating member and enabling fine regulation of the position, the high-frequency diode oscillator is downsized as a whole.

According to the invention, it is preferable that the distance between the frequency regulating member and the strip conductor is $\lambda/2$ or less. With this, the frequency regulating member and the strip conductor are electromagnetically coupled to each other in a preferable manner. By finely regulating the degree of electromagnetic coupling in such a state, it is possible to finely regulate the substantial resonator length of the resonator.

As shown in FIGS. 14–18, the invention provides a millimeter-wave transmitting/receiving apparatus comprising the following parts disposed between parallel plate conductors disposed at an interval equal to or less than one half of wavelength of transmission millimeter-wave signals.

(a) A high-frequency diode oscillator for outputting millimeter-wave signals, including:
   a metal member on which a high-frequency diode for oscillating high-frequency signals, a choke-type bias supply strip for supplying a bias voltage to the high-frequency diode, the choke-type bias supply strip comprising wide strips and narrow strips which are alternately arranged, and a strip conductor for linearly connecting the choke-type bias supply strip and the high-frequency diode are disposed; and
   a dielectric strip disposed in a vicinity of the high-frequency diode, for receiving and propagating the millimeter-wave signals,
   lengths of the wide strips and narrow strips of the choke-type bias supply strip being set to approximately $\lambda/4$ ($\lambda$ represents a wavelength of a high-frequency signal), respectively, and a length of the strip conductor being set to approximately $\{(\frac{3}{4})+n\}\lambda$ (n represents an integer of 0 or more).

(b) A first dielectric strip having one end where the high-frequency diode is disposed, for propagating a millimeter-wave signal outputted from the high-frequency diode oscillator.

(c) A variable capacitance diode disposed so that a bias voltage applying direction coincides with an electric field direction of the millimeter-wave signal, for periodically controlling a bias voltage and thereby outputting the millimeter-wave signal as a frequency-modulated transmission millimeter-wave signal.

(d) A second dielectric strip having one end which is disposed in proximity to or joined to a portion of the first dielectric strip on a downstream side from the variable capacitance diode in a transmitting direction of the transmission millimeter-wave signal, so as to be electromagnetically coupled with the portion.

(e) A circulator having an input end, an input/output end and an output end, the other end of the first dielectric strip being coupled with the input end, a transmission millimeter-wave signal inputted to the input end being outputted to the input/output end, a reception signal inputted to the input/output end being outputted to the output end.

(f) A third dielectric strip having one end which is coupled to the input/output end of the circulator, and another end where a transmission/reception antenna is disposed.

(g) A fourth dielectric strip having one end which is coupled with the output end of the circulator.

(h) A mixer for mixing signals transmitted to the second and fourth dielectric strips, and generating intermediate-frequency signals by disposing in proximity to each other or joining a mid-portion of the second dielectric strip and a mid-portion of the fourth dielectric strip so as to be electromagnetically coupled to each other.

The invention provides a millimeter-wave transmitting/receiving apparatus comprising the following parts disposed between parallel plate conductors disposed at an interval equal to or less than one half of wavelength of transmission millimeter-wave signals.

(a) A high-frequency diode oscillator for outputting millimeter-wave signals, including:

a metal member on which a high-frequency diode for oscillating high-frequency signals, a choke-type bias supply strip for supplying a bias voltage to the high-frequency diode, the choke-type bias supply strip comprising wide strips and narrow strips which are alternately arranged, and a strip conductor for linearly connecting the choke-type bias supply strip and the high-frequency diode are disposed; and a dielectric strip disposed in a vicinity of the high-frequency diode, for receiving and propagating the millimeter-wave signals, lengths of the wide strips and narrow strips of the choke-type bias supply strip being set to approximately $\lambda/4$ ($\lambda$ represents a wavelength of a high-frequency signal), respectively, and a length of the strip conductor being set to approximately $\{(3/4)+n\}\lambda$ (n represents an integer of 0 or more).

(b) A first dielectric strip having one end where the high-frequency diode is disposed, for propagating a millimeter-wave signal outputted from the high-frequency diode oscillator.

(c) A pulse modulation diode disposed to be interposed in or attached to the first dielectric strip so that a bias voltage applying direction coincides with an electric field direction of the millimeter-wave signal, for outputting a transmission millimeter-wave signal obtained by pulse-modulating the millimeter-wave, by on-off of a bias voltage.

(d) A second dielectric strip having one end which is disposed in proximity to or joined to a portion of the first dielectric strip on an upstream side from the pulse modulation diode in a transmitting direction of the transmission millimeter-wave signal, so as to be electromagnetically coupled with the portion.

(e) A circulator having an input end, an input/output end and an output end, the other end of the first dielectric strip being coupled with the input end, a transmission millimeter-wave signal inputted to the input end being outputted to the input/output end, a reception signal inputted to the input/output end being outputted to the output end.

(f) A third dielectric strip having one end which is coupled to the input/output end of the circulator, and another end where a transmission/reception antenna is disposed.

(g) A fourth dielectric strip having one end which is coupled with the output end of the circulator.

(h) A mixer for mixing signals transmitted to the second and fourth dielectric strips, and generating intermediate-frequency signals by disposing in proximity to each other or joining a mid-portion of the second dielectric strip and a mid-portion of the fourth dielectric strip so as to be electromagnetically coupled to each other.

The invention provides a millimeter-wave transmitting/receiving apparatus comprising the following parts disposed between parallel plate conductors disposed at an interval equal to or less than one half of wavelength of transmission millimeter-wave signals (a) A high-frequency diode oscillator for outputting millimeter-wave signals, including:

a metal member on which a high-frequency diode for oscillating high-frequency signals, a choke-type bias supply strip for supplying a bias voltage to the high-frequency diode, the choke-type bias supply strip comprising wide strips and narrow strips which are alternately arranged, and a strip conductor for linearly connecting the choke-type bias supply strip and the high-frequency diode are disposed; and a dielectric strip disposed in a vicinity of the high-frequency diode, for receiving and propagating the millimeter-wave signals, lengths of the wide strips and narrow strips of the choke-type bias supply strip being set to approximately $\lambda/4$ ($\lambda$ represents a wavelength of a high-frequency signal), respectively, and a length of the strip conductor being set to approximately $\{(3/4)+n\}\lambda$ (n represents an integer of 0 or more).

(b) A first dielectric strip having one end where the high-frequency diode is disposed, for propagating a millimeter-wave signal outputted from the high-frequency diode oscillator.

(c) A variable capacitance diode disposed so that a bias voltage applying direction coincides with an electric field direction of the millimeter-wave signal, for periodically controlling a bias voltage and thereby outputting the millimeter-wave signal as a frequency-modulated transmission millimeter-wave signal.

(d) A second dielectric strip having one end which is disposed in proximity to or joined to a portion of the first dielectric strip on a downstream side from the variable capacitance diode in a transmitting direction of the transmission millimeter-wave signal, so as to be electromagnetically coupled with the portion.

(e) A circulator having an input end, an input/output end and an output end, the other end of the first dielectric strip being coupled with the input end, a transmission millimeter-wave signal inputted to the input end being outputted to the input/output end, a reception signal inputted to the input/output end being outputted to the output end.

(f) A third dielectric strip having one end which is coupled to the input/output end of the circulator, and another end where a transmission antenna is disposed.

(g) A terminator coupled to the output end of the circulator.
(h) A fourth dielectric strip having one end where a reception antenna is disposed, for guiding a received millimeter-wave signal.
(i) A mixer for mixing signals transmitted to the second and fourth dielectric strips, and generating intermediate-frequency signals by disposing in proximity to each other or joining a mid-portion of the second dielectric strip and a mid-portion of the fourth dielectric strip so as to be electromagnetically coupled to each other.

The invention provides a millimeter-wave transmitting/receiving apparatus comprising the following parts disposed between parallel plate conductors disposed at an interval equal to or less than one half of wavelength of transmission millimeter-wave signals.

(a) A high-frequency diode oscillator for outputting millimeter-wave signals, including:
a metal member on which a high-frequency diode for oscillating high-frequency signals, a choke-type bias supply strip for supplying a bias voltage to the high-frequency diode, the choke-type bias supply strip comprising wide strips and narrow strips which are alternately arranged, and a strip conductor for linearly connecting the choke-type bias supply strip and the high-frequency diode are disposed; and
a dielectric strip disposed in a vicinity of the high-frequency diode, for receiving and propagating the millimeter-wave signals,
lengths of the wide strips and narrow strips of the choke-type bias supply strip being set to approximately $\lambda/4$ ($\lambda$ represents a wavelength of a high-frequency signal), respectively, and a length of the strip conductor being set to approximately $\{(3/4)+n\}\lambda$ (n represents an integer of 0 or more).
(b) A first dielectric strip having one end where the high-frequency diode is disposed, for propagating a millimeter-wave signal outputted from the high-frequency diode oscillator.
(c) A pulse modulation diode disposed to be interposed in or attached to the first dielectric strip so that a bias voltage applying direction coincides with an electric field direction of the millimeter-wave signal, for outputting a transmission millimeter-wave signal obtained by pulse-modulating the millimeter-wave, by on-off of a bias voltage.
(d) A second dielectric strip having one end which is disposed in proximity to or joined to a portion of the first dielectric strip on an upstream side from the pulse modulation diode in a transmitting direction of the transmission millimeter-wave signal, so as to be electromagnetically coupled with the portion.
(e) A circulator having an input end, an input/output end and an output end,
the other end of the first dielectric strip being coupled with the input end,
a transmission millimeter-wave signal inputted to the input end being outputted to the input/output end,
a reception signal inputted to the input/output end being outputted to the output end.
(f) A third dielectric strip having one end which is coupled to the input/output end of the circulator, and another end where a transmission antenna is disposed.
(g) A terminator coupled to the output end of the circulator.
(h) A fourth dielectric strip having one end where a reception antenna is disposed, for guiding a received millimeter-wave signal.
(i) A mixer for mixing signals transmitted to the second and fourth dielectric strips, and generating intermediate-frequency signals by disposing in proximity to each other or joining a mid-portion of the second dielectric strip and a mid-portion of the fourth dielectric strip so as to be electromagnetically coupled to each other.

BRIEF DESCRIPTION OF THE DRAWINGS

Other and further objects, features, and advantages of the invention will be more explicit from the following detailed description taken with reference to the drawings wherein:

FIG. 11 is a perspective view of the inside of a NRD guide type of high-frequency diode oscillator of the invention;

FIG. 12A is a plan view of a choke-type bias supply strip, a strip conductor and a column-like frequency regulating member, and FIG. 12B is a cross-section view of FIG. 12A;

FIG. 13A is a plan view of a choke-type bias supply strip, a strip conductor and a screw-like frequency regulating member, and FIG. 13B is a cross-section view of FIG. 13A;

DETAILED DESCRIPTION OF THE PREFERRED EMBODIMENTS

Figure 1:
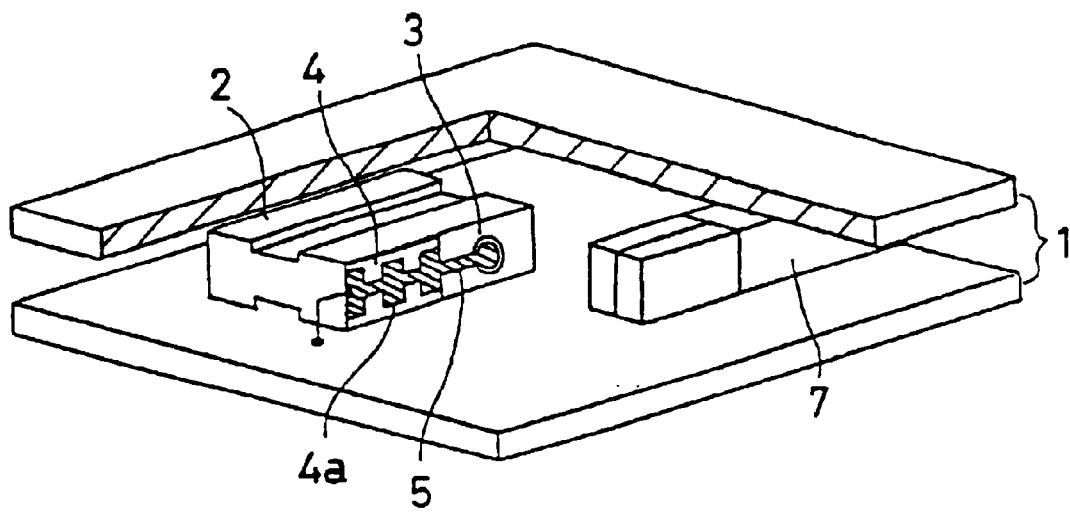
FIG. 1 is a perspective view of the inside of a NRD guide type of high-frequency diode oscillator of the invention.

Now referring to the drawings, preferred embodiments of the invention are described below.

Figure 2:
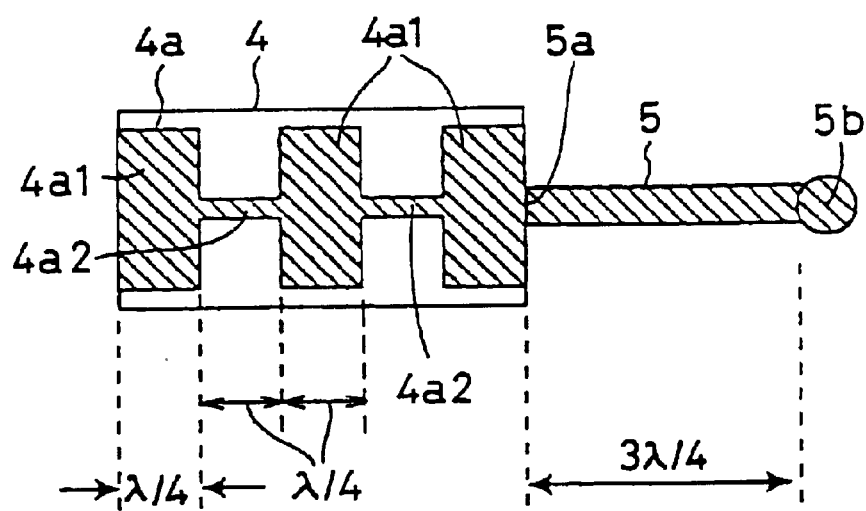
FIG. 2 is a plan view of a choke-type bias supply strip and a strip conductor of the invention.
Figure 3:
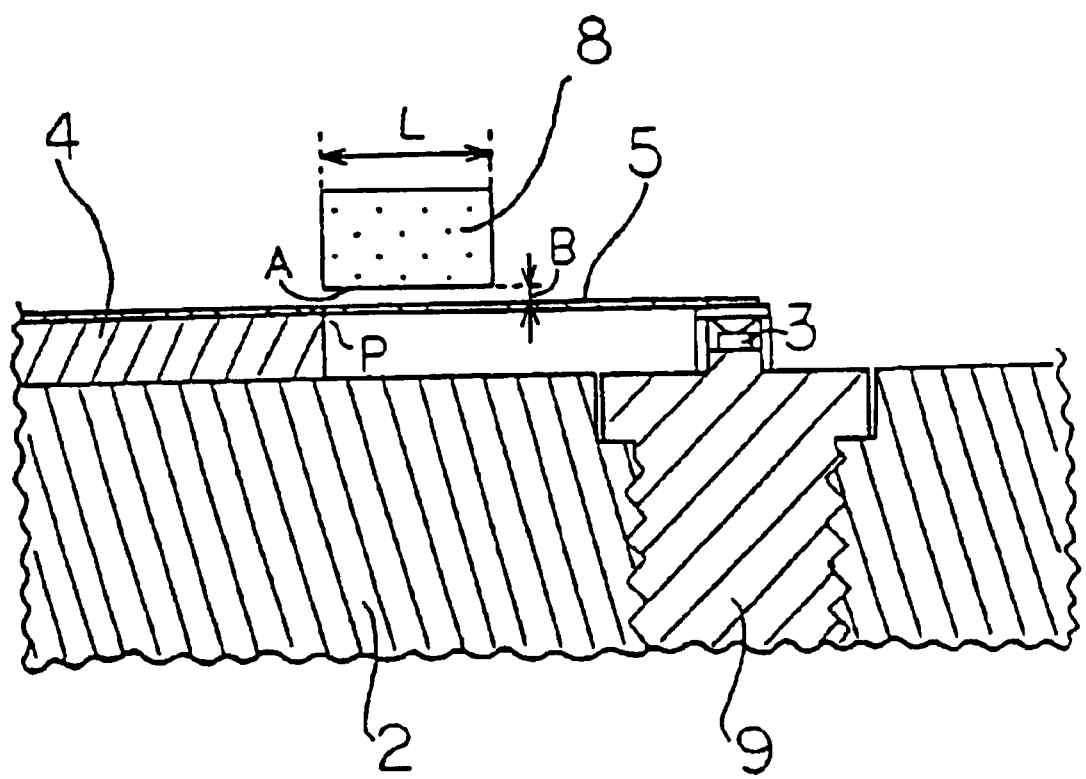
FIG. 3 is a partial section view of a strip conductor and a Gunn diode device in the case of placing a dielectric chip for regulating the oscillation frequency in proximity to the strip conductor in the invention.

A high-frequency diode oscillator of a first embodiment of the present invention will be explained below. FIGS. 1–3 show a NRD guide type of high-frequency diode oscillator of the invention. In these drawings, reference numeral 1 denotes a pair of parallel plate conductors which are disposed at an interval equal to or less than one half of wavelength $\lambda$ of high-frequency signals in the air oscillated by a high-frequency diode such as a Gunn diode, reference numeral 2 denotes a nearly rectangular parallelepiped metal member such as a metal block for mounting a Gunn diode device, reference numeral 3 denotes a Gunn diode device which is a kind of high-frequency diode oscillating microwaves and millimeter-waves, reference numeral 4 denotes a wiring board which is mounted on one side surface of the metal member Z and which is provided with a choke-type bias supply strip 4a supplying a bias voltage to the Gunn diode device 3 and functioning as a low-pass filter preventing leakage of high-frequency signals, reference numeral 5 denotes a strip conductor such as a metal foil ribbon which connects the choke-type bias supply strip 4a and the upper conductor of the Gunn diode device 3, and reference numeral 7 denotes a dielectric strip disposed in the vicinity of the Gunn diode 3, which receives high-frequency signals and propagates outside. In FIG. 1, the upper one of the parallel plate conductors 1 is partially cut away in order to show the interior thereof.

In the invention, as shown in FIG. 2, the choke-type bias supply strip 4a is composed of wide and narrow strips, in which the spatial cycle (length of one) of wide strips 4a1 and the spatial cycle (length of one) of narrow strips 4a2 are approximately $\lambda/4$, respectively. Further, the length of the strip conductor 5 is approximately $\{(3/4)+n\}\lambda$ (n represents an integer of 0 or more). It is preferable that the length of the strip conductor 5 is approximately $3\lambda/4$ to approximately $\{(3/4)+3\}\lambda$. In the case where the length is over approximately $\{(3/4)+3\}\lambda$, the strip conductor 5 becomes long. As a result, such problems arise that the strip conductor is bent or twisted easily and thereby variations in characteristics of the oscillation frequency or the like becomes large among individual high-frequency diode oscillators, as well as various resonant modes are generated and thereby signals of a different frequency from a desired oscillation frequency are generated. It is further preferable that the length is approximately $3\lambda/4$ to approximately $\{(3/4)+1\}\lambda$.

The reason for setting the length to approximately $\{(3/4)+n\}\lambda$ is that resonance can occur even in the case where the length deviates a little from $\{(3/4)+n\}\lambda$. For example, the strip conductor 5 may be formed about 10–20% longer than $\{(3/4)+n\}\lambda$, in which case, it is expected that part of the length $\lambda/4$ of the first pattern (the rightmost wide strip portion in FIG. 2) of the choke-type bias supply strip 4a contacting the strip conductor 5 contributes to resonance. Therefore, the length of the strip conductor 5 can be changed in the range of about $\{(3/4)+n\}\lambda \pm 20\%$.

The material of the choke-type bias supply strip 4a and the strip conductor 5 is Cu, Al, Au, Ag, W, Ti, Ni, Cr, Pd, Pt or the like. In specific, Cu and Ag have a good electric conductivity, so that they are preferable in low loss and large oscillation output.

Further, although the choke-type bias supply strip 4a is formed on the wiring board 4 such as a print wiring board, and one end of the strip conductor 5 is connected to the choke-type bias supply strip 4a and the other end thereof is connected to the upper conductor of the Gunn diode device 3 by soldering or heat crimping, the strip conductor 5 may also be formed on the wiring board 4 and integrated with the choke-type bias supply strip 4a.

Further, the strip conductor 5 is spaced at a predetermined interval from the surface of the metal member 2 and electromagnetically coupled to the metal member 2, and spanned between the choke-type bias supply strip 4a and the Gunn diode 3. That is to say, one end 5a of the strip conductor 5 is connected to one end of the choke-type bias supply strip 4a by soldering or the like, the other end 5b of the strip conductor 5 is connected to the upper conductor of the Gunn diode 3 by soldering or the like, and a mid-portion excluding the connected portions of the strip conductor 5 is suspended in midair.

Since also electrically grounding the Gunn diode 3, the metal member 2 can be any kind of metal conductors, and the material thereof is not restricted in specific, which is brass (Cu—Zn alloy), Al, Cu, SUS (stainless steel), Ag, Au, Pt or the like. Further, the metal member 2 may be a metal block which is entirely made of metal, an insulation substrate such as ceramics or plastic whose surface is entirely or partially metal-plated, or an insulation substrate whose surface is entirely or partially coated with a conductive material.

The metal member 2 on which the high-frequency diode 3 is disposed will be explained still more.

By embedding the high-frequency diode 3 into the side surface of the metal member 2 and forming a concave portion for fitting the metal member 2 on the inner surface of the parallel plate conductor 1, it is possible to use a versatile high-frequency diode 3 whose size is too large to be disposed between the pair of parallel plate conductors 1. Further, by forming grooves, which intersect (preferably, intersect at right angles) with the oscillation axis of high-frequency signals of the high-frequency diode 3, on the top and bottom surfaces of the metal member 2, it is possible to suppress leakage of high-frequency signals. In this case, it is preferable to set the width of the grooves to approximately $m \times \lambda/4$ (m represents an integer of 1 or more). In the case of m<1, an effect of suppressing leakage of high-frequency signals is small. Further, it is further preferable to set the width of the grooves to $1 \leq m \leq 3$. In the case of 3<m, the effect of suppressing leakage of high-frequency signals is hard to increase, and moreover the width of the grooves is so large that the metal member becomes large in size.

Further, it is preferable that the material of the dielectric Strip 7 is cordierite ($2MgO \cdot 2Al_2O_3 \cdot 5SiO_2$) ceramics, alumina ($Al_2O_3$) ceramics or the like, which are low-loss in a high-frequency bandwidth. It is preferable that the interval between the Gunn diode device 3 and the dielectric strip 7 is about 1.0 mm or less. In the case of over 1.0 mm, the interval exceeds the largest separation width that enables reduction of losses and establishment of electromagnetic coupling.

In the invention, as shown in a section view of FIG. 3, it is preferable to place a dielectric chip 9 which regulates the oscillation frequency of high-frequency signals, in proximity to the strip conductor 5. In FIG. 3, reference numeral 9 denotes a screwing portion for the Gunn diode device 3. Although the shape of the dielectric chip 8 is not restricted in specific, it is preferable that the shape is a rectangular parallelepiped, a plate, a quadrangular pyramid, a prism such as a triangular prism, a semicylinder or the like, which has a parallel main surface A opposed and in proximity to the main surface of the strip conductor 5. These shapes have an advantage of easy control of electromagnetic coupling with high-frequency signals propagating through the strip conductor 5 by the main surface A. Then, by regulating a length L of the main surface A, or preparing dielectric chips 8 with different lengths L to change the length L, it is possible to control the oscillation frequency. That is to say, by placing the dielectric chip 8 in proximity to the strip conductor 5, it is possible to finely regulate the substantial resonator length of a resonator composed of the choke-type bias supply strip 4a and the strip conductor 5. For example, by setting the electric resonator length or the strip conductor 5 slightly larger than $\{(3/4)+n\}\lambda$, it is possible to lower the oscillation frequency.

It is preferable that the dielectric chip 8 is made or cordierite ceramics, alumina ceramics or the like, which are low-loss in a high-frequency bandwidth. Further, it is preferable that an interval B between the main surface A of the dielectric chip 8 and the main surface of the strip conductor 5 is 0.1–1.0 mm. In the case of below 0.1 mm, the dielectric chip 8 is displaced due to vibrations, or the dielectric chip 8 is deformed by heat and bent to contact the strip conductor 5, with the result that propagation characteristics of high-frequency signals become easy to change In the case of above 1.0 mm, electromagnetic coupling between the strip conductor 5 and the dielectric chip 8 is so weak that it is difficult to control the oscillation frequency.

A high-frequency bandwidth referred to in the invention corresponds to a microwave bandwidth and a millimeter-wave bandwidth of tens to hundreds GHz, and a high-frequency bandwidth of 30 GHz or more, specifically 50 GHz or more, more specifically 70 GHz or more is preferable.

As the high-frequency diode of the invention, a microwave diode and a millimeter-wave diode such as an impatt (impact ionisation avalanche transit time) diode, a trapatt (trapped plasma avalanche triggered transit) diode or a Gunn diode are preferably used.

The parallel plate conductors 1 for the NRD guide of the invention, in terms of high electric conductivity and processibility, may be conductor plates of Cu, Al, Fe, SUS (stainless steel), Ag, Au, Pt or the like, or such conductor layers formed on the surfaces of insulation plates made of ceramics, resin or the like.

The NRD guide type of high-frequency diode oscillator of the invention is used for a wireless LAN, an automotive millimeter-wave radar or the like. For example, by irradiating obstacles and automobiles around an automobile with millimeter waves and synthesizing reflection waves with the original millimeter waves to obtain beat signals, and analyzing the beat signals, it is possible to measure the distance from the obstacles and automobiles, the moving speed and moving direction thereof, and so on.

Accordingly, in the invention, the choke-type bias supply strip and the strip conductor function as a resonator which determines the oscillation frequency of the high-frequency diode, thereby eliminating the need for another resonator such as a metal strip resonator. Therefore, positioning of the metal member for mounting the high-frequency diode and the dielectric strip is facilitated, and workability in production is largely increased. Further, since an extra resonator such as a metal strip resonator is not used, there is no loss caused thereby, and there is such an effect that propagation characteristics of high-frequency signals are increased.

Example 1 of the invention will be explained below.

EXAMPLE 1

The NRD guide type of Gunn diode oscillator as in FIG. 1 is configured in the following manner. As the pair of parallel plate conductors 1, 1, Al plates (depth×width×thickness=100 mm×100 mm×2 mm) are disposed at an interval of 1.8 mm, and a metal member 2 made of brass against which a Gunn diode device 3 is screwed and a dielectric strip 7 made of cordierite ceramics are disposed between the Al plates. The metal member 2 is formed into a rectangular parallelepiped with height of about 1.8 mm, and on one side surface thereof, a Gunn diode device 3 which oscillates high-frequency signals (electromagnetic waves) with oscillation frequency of 77 GHz and wavelength $\lambda$ of 3.9 mm, a wiring board 4 on which a choke-type bias supply strip 4a inputting a bias voltage to the Gunn diode device 3 is formed, and a strip conductor 5 which connects the choke-type bias supply strip 4a and the upper conductor of the Gunn diode device 3 are disposed.

The wiring board 4 is made of glass epoxy resin, and secured to the metal member 2 with an adhesive. Further, regarding the wide strips and narrow strips of the choke-type bias supply strip 4a, the spatial cycle (length of one) of the wide strips is $\lambda/4=0.70$ mm (shorten the wavelength on the dielectric board), the spatial cycle of the narrow strips is $\lambda/4-0.70$ mm, the width of the wide strip portions is 1.5 mm, and the width of the narrow strip portions is 0.2 mm. The strip conductor 5 is made of copper foil ribbon (thickness× width×length=35 μm×0.6 mm×3.2 mm), one end of which is soldered to the choke-type bias supply strip 4a and the other end of which is soldered to the upper conductor of the Gunn diode device 3, respectively. The dielectric strip 7 is made of cordierite ceramics whose relative dielectric constant is 5, and spaced at an interval of about 0.5 mm from the upper conductor of the Gunn diode device 3.

Figure 4:
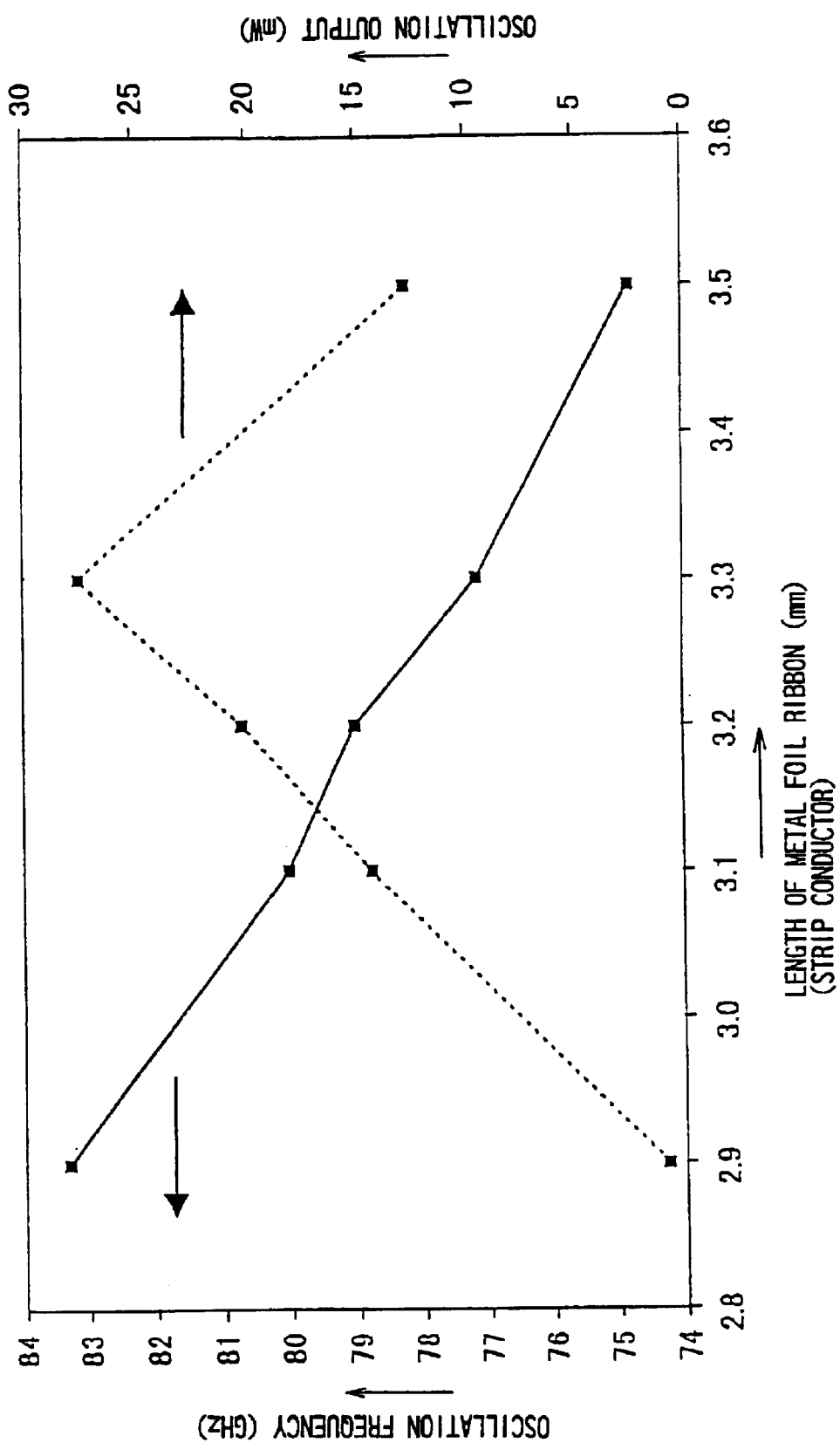
FIG. 4 is a graph showing the oscillation frequency and oscillation output in the case of changing the length of the strip conductor in the high-frequency diode oscillator of the invention.

The oscillation frequency and the oscillation output of the Gunn diode device 3 in the case of variously changing the length of the strip conductor 5 are shown in a graph of FIG. 4. As apparent from FIG. 4, by regulating the length of the strip conductor 5, it is possible to control the oscillation frequency and obtain high output of high-frequency signals. Herein, the reason of showing the largest oscillation output when the length of the strip conductor 5 is 3.3 mm, which is about 14% larger than $3\lambda/4 \approx 2.9$ mm, is thought because part of the first pattern of the choke-type bias supply strip 4a contributes to resonance.

Figure 5:
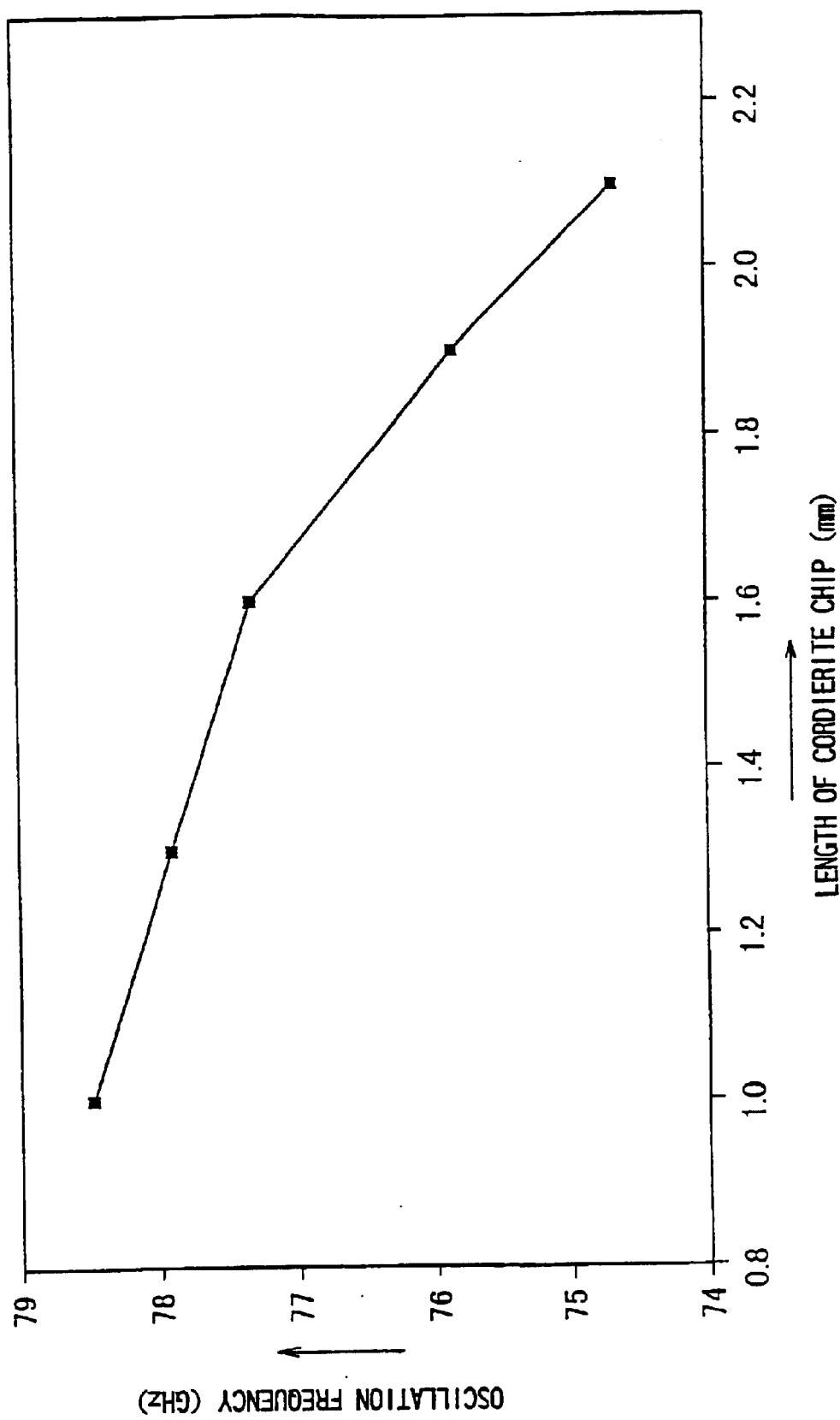
FIG. 5 is a graph showing the oscillation frequency in the case of changing the length of the dielectric chip in the high-frequency diode oscillator of the invention.

Further, the length of the strip conductor 5 is set to 3.2 mm, and as shown in FIG. 3, a rectangular parallelepiped dielectric chip 8 made of cordierite ceramics whose relative dielectric constant is 5 (length L, width 0.4 mm, height 1.8 mm) is spaced at an interval B of 0.1 mm from the strip conductor. One end of the dielectric chip 8 is aligned over a joint point P between the wiring board 4 and the strip conductor 5, and change of the oscillation frequency in the case of variously changing the length L is shown in a graph of FIG. 5. As apparent from FIG. 5, by changing the length L of the dielectric chip 8, it is possible to control the oscillation frequency.

In the drawings attached to the specification, in order to clarify the configuration, the strip 4a, the conductor 5 and so on are diagonally shaded.

Figure 6:
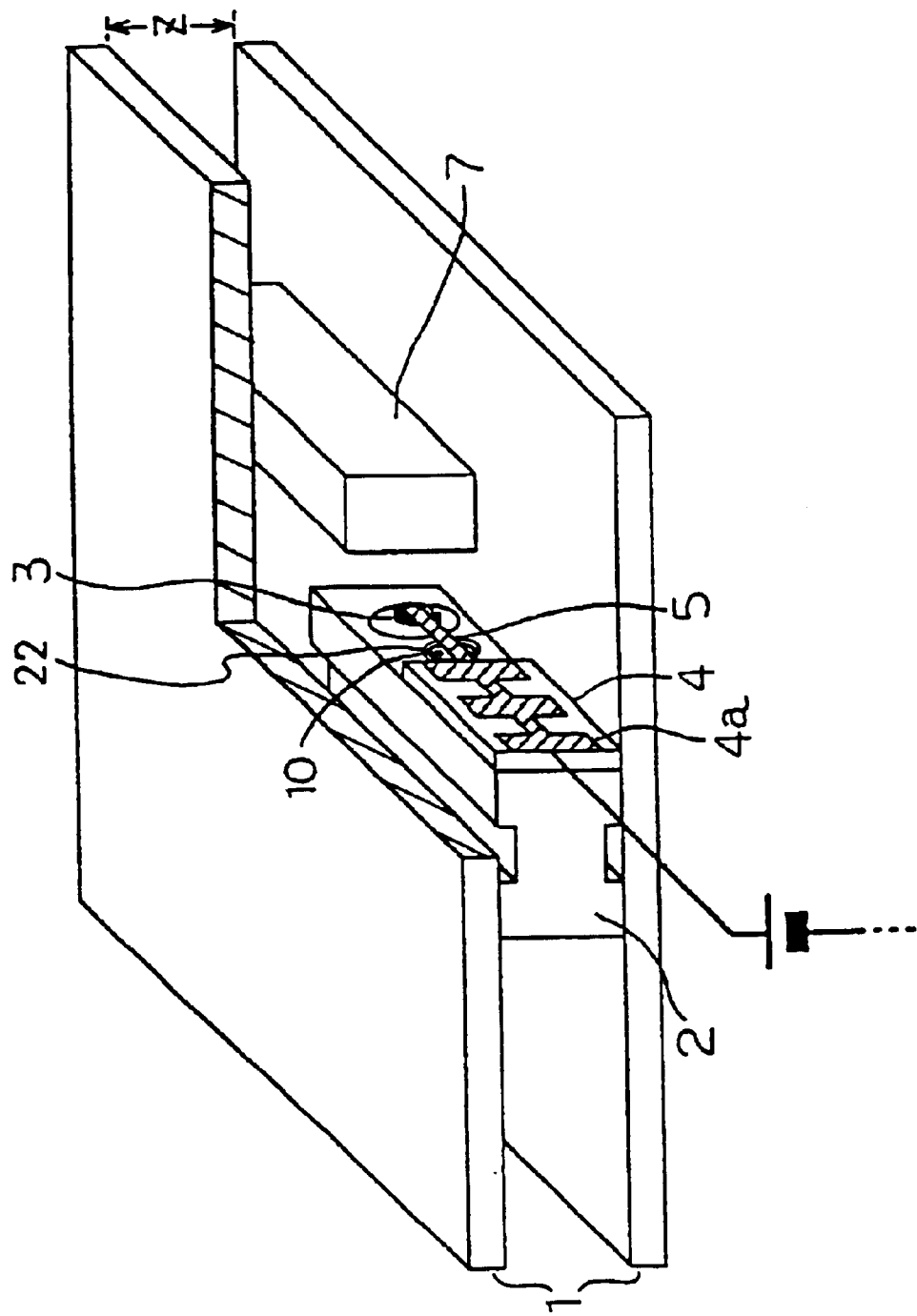
FIG. 6 is a perspective view of the inside of a NRD guide type of high-frequency oscillator of the invention.

FIG. 6 is a partially cutaway view in perspective of a high-frequency diode oscillator of a second embodiment of the invention. The second embodiment of the invention as shown in FIGS. 6 and 7 and a third embodiment of the invention as shown in FIG. 8 are similar to the embodiment as shown in FIGS. 1–3, and like elements will be denoted by like reference numerals.

Figure 7:
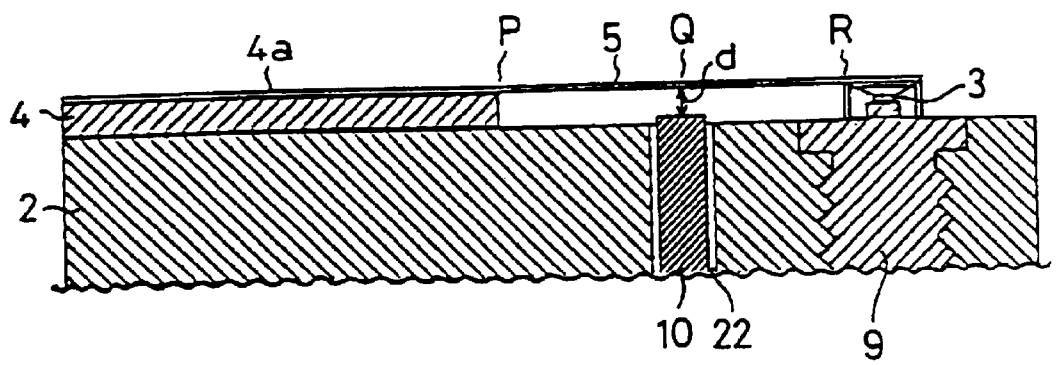
FIG. 7 shows the high-frequency diode oscillator of the invention, which is a partial section view of a frequency regulating member and the periphery thereof.
Figure 8:
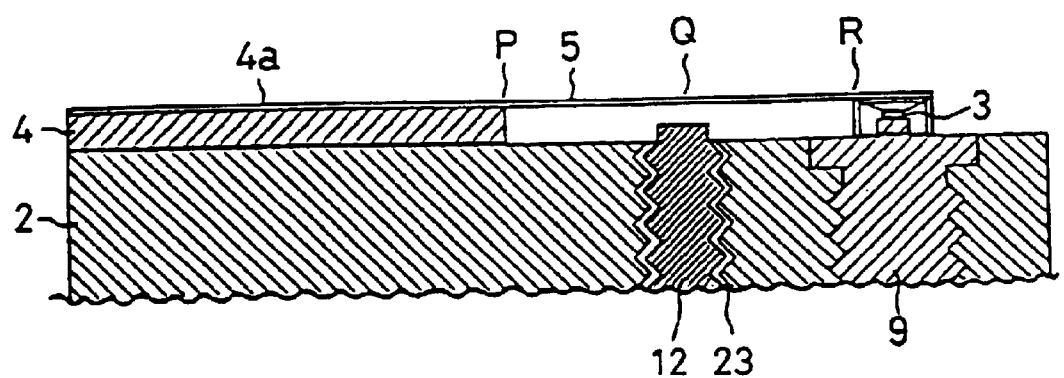
FIG. 8 shows another embodiment of a high-frequency diode oscillator of the invention, which is a partial section view of a frequency regulating member and the periphery thereof.

The partial section views of a frequency regulating member of the invention and the periphery thereof are shown in FIGS. 7 and 8. As shown in FIGS. 7 and 8, a hole 22, 23 is formed at a position corresponding to the strip conductor 5 on the metal member 2. A column-like frequency regulating member 10, 12 is inserted and disposed in the hole 22, 23, and the end of the frequency regulating member 10, 12 protrudes through the surface of the metal member 2 so as to be in proximity to the strip conductor 5 to be electromagnetically coupled thereto. The hole 22, 23 may be a through hole. In this case, it is possible to insert the frequency regulating member 10, 12 from the opposite surface of the metal member 2 to the strip conductor 5 and regulate the position, which is preferable.

Further, in the third embodiment as shown in FIG. 8, by forming the hole 23 into a screw hole with threads cut inside, screwing the screw-like frequency regulating member 12 in the hole 23, and inserting the member while rotating, it becomes possible to more finely perform fine regulation of the position. With this, it becomes possible to control the oscillation frequency more finely. A plurality of frequency regulating members 10, 12 may be formed at positions corresponding to the strip conductor 5 of the metal member 2. For example, by disposing a member with large section area and a member with small section area, it is possible to roughly regulate the frequency with the member with large section area, and finely regulate the frequency with the member with small section area.

As the material of the frequency regulating member 10, 12, dielectric materials such as cordierite ($2MgO \cdot 2Al_2O_3 \cdot 5SiO_2$) ceramics or alumina ($Al_2O_3$) ceramics and metals such as Cu, Al Fe or SUS (stainless steel) are desirable. The above dielectric materials make low dielectric loss to high-frequency signals, and the above metals are excellent in processibility.

Thus, by placing the frequency regulating member 10, 12 in proximity to the strip conductor 5 and regulating the interval thereof, it is possible to change the coupling capacity between the strip conductor 5 and the frequency regulating member 10, 12, and thereby finely regulate the substantial resonator length of the resonator composed of the choke-type bias supply strip 4a and the strip conductor 5. For example, it is possible to set the electric resonator length of the strip conductor 5 slightly larger than approximately $\{(3/4)+n\}\lambda$ and decrease the oscillation frequency.

It is desirable to set an interval d between the frequency regulating member 10, 12 and the strip conductor 5 (FIG. 7) to 0.05–0.10 mm. In the case of below 0.05 mm, the frequency regulating member 10, 12 is likely to contact the strip conductor 5, whereas in the case of above 0.10 mm, the frequency regulating member 10, 12 is hard to be electromagnetically coupled with the strip conductor 5, so that it becomes difficult to control the oscillation frequency.

Moreover, instead of regulating the interval d between the frequency regulating member 10, 12 and the strip conductor 5, by regulating the area of an end surface of the frequency regulating member 10, 12 opposed to the strip conductor 5, it is also possible to control the oscillation frequency. In the case where the area of the end surface is small, fine control is allowed and the frequency modulative width becomes small. In the case where the area of the end surface is large, relatively rough control is allowed and the frequency modulative width becomes large. It is preferable that the area of the end surface is 0.10–2.0 mm$^2$. In the case of below 0.10 mm$^2$, it is difficult to control the oscillation frequency, whereas in the case of above 2.0 mm$^2$, the width of the section of the frequency regulating member 10, 12 becomes large, so that the member is likely to contact the parallel plate conductors 1, and a portion thereof which lies off the strip conductor 5 hardly has an effect on frequency control. It is further preferable to set the area to 0.13–0.8 mm$^2$.

Thus, the invention has a configuration in which the choke-type bias supply strip and the strip conductor function as a resonator which determines the oscillation frequency of the high-frequency diode. When the frequency regulating member is disposed in proximity to the strip conductor to be electromagnetically coupled thereto, it is possible to finely regulate the position of the frequency regulating member 10, 12 with ease and reproducibility. With this, it is possible to finely regulate the substantial resonator length of the resonator, and as a result, it is possible to finely regulate the oscillation frequency with reproducibility. Further, by downsizing the frequency regulating member 10, 12 and allowing fine regulation of the position thereof, it is possible to downsize the whole high-frequency diode oscillator.

Examples 2 and 3 of the invention will be explained below.

EXAMPLES 2 AND 3

The NRD guide type of Gunn diode oscillator as shown in FIG. 6 is configured in the following manner. The configuration of example 2 is the same as the configuration of example 1 except a part of the configuration associated with the frequency regulating member 10, 12.

As shown in FIG. 7, at a position of the metal member 2 which corresponds to a middle point Q between an upper conductor end R of the Gunn diode 3 and a joint point P of the wiring board 4 and the strip conductor 5, a through hole 22 with diameter of 0.8 mm is formed, and a column-like frequency regulating member 10, whose diameter is 0.8 mm and end surface area of which is about 0.5 mm$^2$, made of cordierite ceramics with relative dielectric constant of 5 is inserted into the through hole 22, whereby the Gunn diode oscillator is produced.

Regarding this Gunn diode oscillator, while the oscillation frequency is 76.249 GHz in the case of keeping the end of the frequency regulating member 10 from protruding through the surface of the metal member 2, that is, in the state of keeping the frequency regulating member 10 and the strip conductor 5 from establishing capacitive coupling or electromagnetic coupling, the oscillation frequency is changed to 75.904 GHz in the case of making the end of the frequency regulating member 10 protrude through the surface of the metal member 2 and setting the interval d between the frequency regulating member 10 and the strip conductor 5 to 0.05 mm. Therefore, it is possible to lower the oscillation frequency by 345 MHz, and it is possible to control the oscillation frequency with reproducibility by regulating the interval d. Also in example 3 or the invention as shown in FIG. 8, a preferable result is obtained in the same manner as in example 2 as shown in FIGS. 6 and 7.

Figure 9:
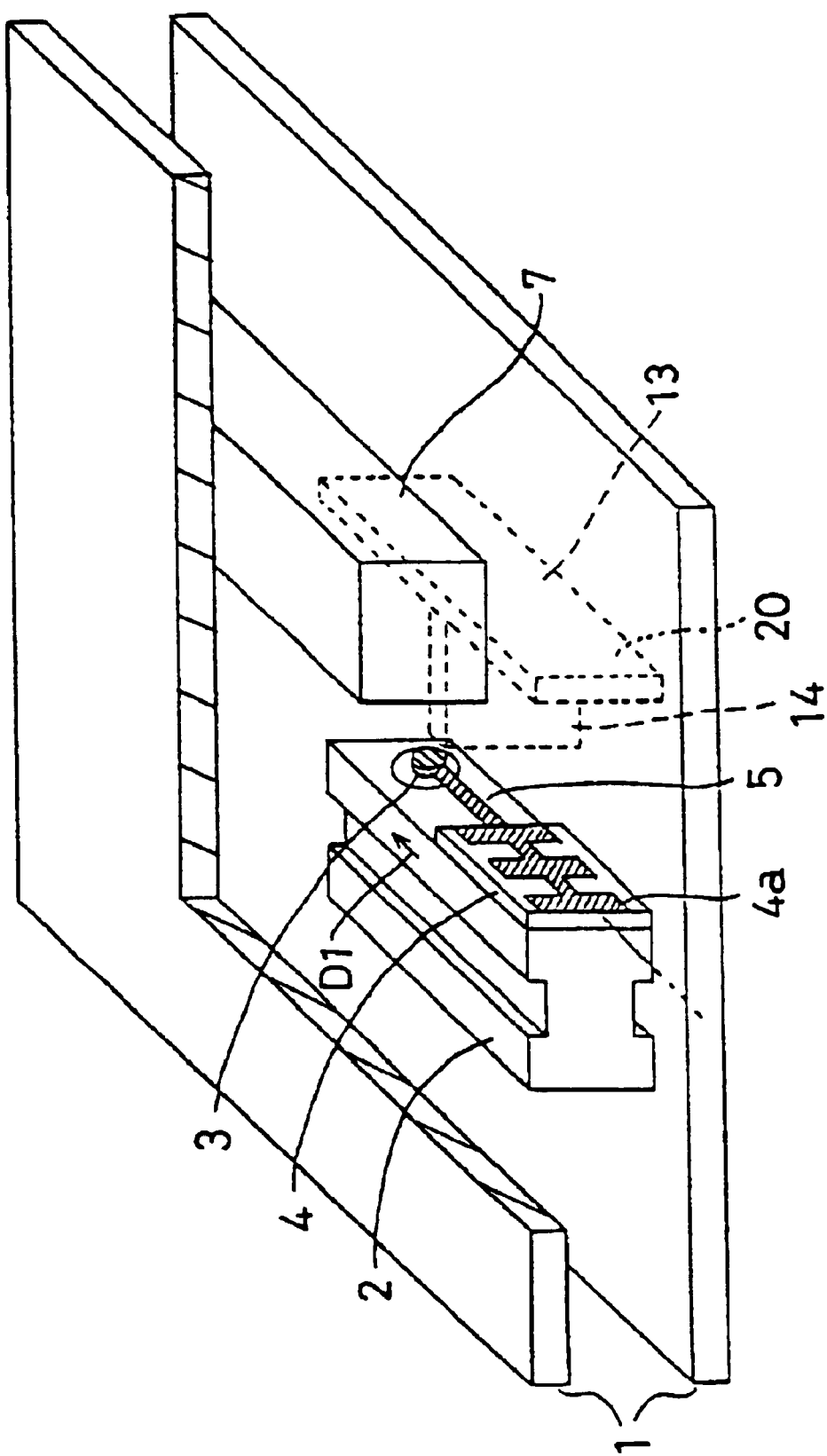
FIG. 9 is a perspective view of the inside of a NRD guide type of high-frequency diode oscillator of the invention.
Figure 10:
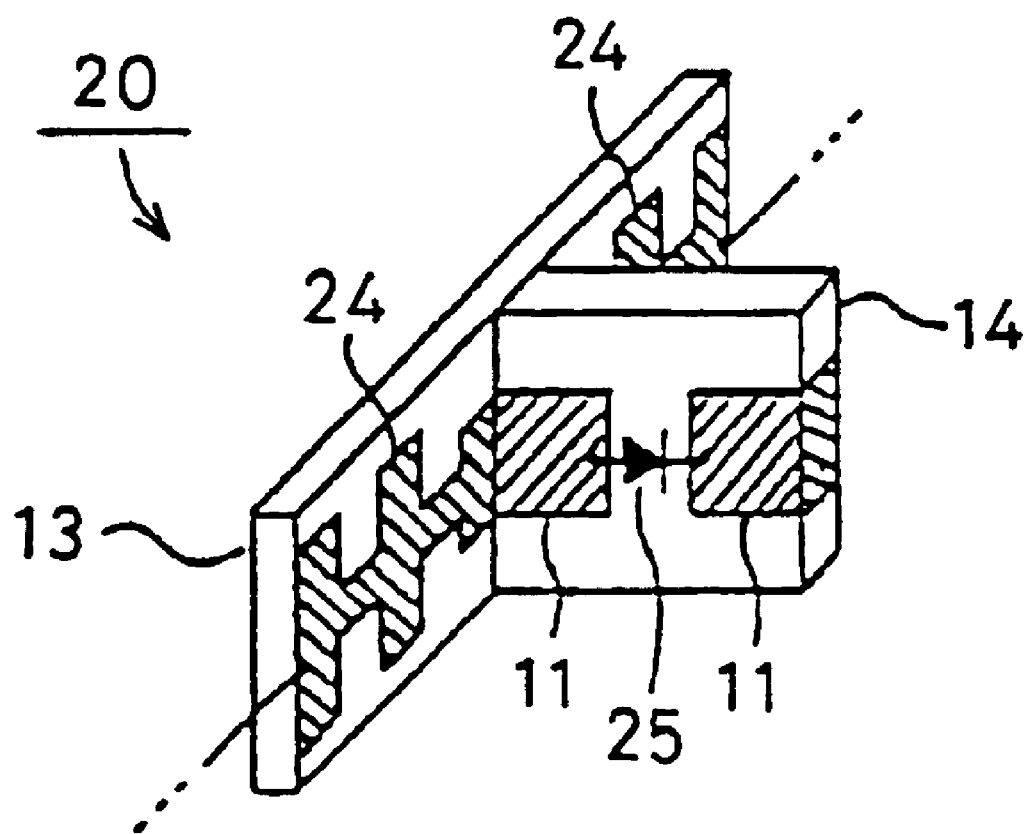
FIG. 10 is a perspective view of a modulation circuit board on which a frequency modulating diode is disposed of the invention.

A voltage control type of high-frequency diode oscillator of a fourth embodiment of the invention will be explained below. FIG. 9 shows an NRD guide type of high-frequency diode oscillator of the invention, and FIG. 10 shows a modulation circuit board 20 which has a frequency modulating diode for the high-frequency diode oscillator of the Invention. The fourth embodiment has the same configuration as the first embodiment as shown in FIGS. 1–3 other than the configuration related to the modulation circuit board 20.

What should be noted is: reference numeral 25 denotes a varactor diode as an example of a frequency modulating diode disposed on an auxiliary board 14; the bias voltage applying direction thereof is set to a direction parallel to an electric field of an electromagnetic field generated at a strip conductor 5 and radiated in a space, that is, set in the state of coinciding with the electric field direction; and the varactor diode 25 is disposed in proximity to the strip conductor 5 to be electromagnetically coupled th reto. Reference numeral 11 denotes an electrode (a connection conductor) for connecting a varactor diode 25 formed on the auxiliary board 14, and reference numeral 24 denotes a second choke-type bias supply strip formed on the main surface of a wiring board 13. Reference numeral 20 denotes a modulation circuit board on which the varactor diode 25 is disposed. The modulation circuit board 20 is composed of the wiring board 13 having the second choke-type bias supply strip 24 formed on the main surface thereof, disposed so that the main surface is perpendicular to parallel plate conductors 1, and the auxiliary board 14 which is set up at a mid-portion of the second choke-type bias supply strip 24 and on the main surface of which a connection conductor connected to the second choke-type bias supply strip 24 is disposed.

In the invention, a choke-type bias supply strip 4a is shown in FIG. 9, and the configuration of this strip 4a is the same as the configuration as shown in FIG. 2.

In the invention, it is preferable to set the interval between the frequency modulating diode and the strip conductor 5 to $\lambda$ or below. In the case of above $\lambda$, frequency modulation by capacity change of the varactor diode 25 becomes difficult, and the width of frequency modulation becomes small. It is further preferable to set the interval between the frequency modulating diode and the strip conductor 5 to 0.1 mm to $\lambda$. In th case of below 0.1 mm, the electrode 11 is likely to contact the strip conductor 5.

Further, it is desirable that the position of the varactor diode 25 with respect to the strip conductor 5 is in the range from the center of the strip conductor 5 up to about a quarter length of the strip conductor 5 toward the side or the choke-type bias supply strip 4a. In the case where the varactor diode 25 is close to a Gunn diode 3 from the center of the strip conductor 5, the oscillation output decreases. In the case where the varactor diode 25 is disposed farther than a quarter length of the strip conductor 5 toward the side of the choke-type bias supply strip 4a, the width of frequency modulation becomes small.

In the above embodiment, the bias voltage applying direction of the varactor diode 25 is set so as to coincide with the direction of an electric field generated at the strip conductor 5, that is, a direction parallel to the parallel plate conductors 1 and a direction perpendicular to the surface of the strip conductor 5. The electric field generated at the strip conductor 5 expands with distance from the strip conductor 5, and components of a direction perpendicular to the parallel plate conductors 1 are generated. Therefore, it is also possible to set the bias voltage applying direction of the varactor diode 25 so as to coincide with the electric field perpendicular to the parallel plate conductors 1.

Thus, in the invention, the choke-type bias supply strip and the strip conductor function as a resonator. By placing the frequency modulating diode in proximity to the strip conductor of the resonator to be electromagnetically coupled with the strip conductor, and changing a bias voltage applied to the frequency modulating diode, it is possible to control the oscillation frequency. Further, since there is no need to place a frequency modulating diode in the dielectric strip, it is possible to obtain a high output with low loss and entirely downsize. Furthermore, by regulating the position of the frequency modulating diode, it is possible to change the strength of electromagnetic coupling between the strip conductor functioning as a resonator and the frequency modulating diode, and thereby regulate the width of frequency modulation.

Example 4 of the invention will be explained below.

EXAMPLE 4

The NRD guide type of Gunn diode oscillator as shown in FIG. 9 is configured in the following manner. As the pair of parallel plate conductors 1, 1, Al plates (depth=80 mm, width=80 mm, thickness=2 mm) are disposed at an interval of 1.8 mm. Other configurations, for example, the configuration related to the Gunn diode 3, are the same as example 1. In specific, in example 4, a beam lead type of varactor diode 25 is mounted on the modulation circuit board 20 of FIG. 10, and the varactor diode 25 is disposed in proximity to a position corresponding to approximately the center of the strip conductor 5 in a state where the auxiliary board 14 is set up between the inside main surfaces of the parallel plate conductors 1. The configuration related to the wiring board 4 and so on is the same as example 1.

The auxiliary board 14 for mounting the varactor diode 25 is made of glass epoxy resin. A 0.2 mm gap is disposed in the center of a conductor pattern (width=1.86 mm and height=1.2 mm) to form electrodes 11, 11 for the connection conductor, and the beam lead type of varactor diode 25 is connected to the electrodes 11, 11 and disposed in the gap. The electrodes 11, 11 extend to a surface of the auxiliary board 14 which is opposite to another surface of the auxiliary board 14, mounted with the varactor diode 25, and both ends of the electrodes 11, 11 are connected to the second choke-type bias supply strip 24 by soldering. Further, the auxiliary board 14 is adhered to the wiring board 13 with an adhesive. The wiring board 13 is made of glass epoxy resin. On the main surface of the wiring board 13, a second choke-type bias supply strip 24 composed of wide strips with width of 1.5 mm and narrow strips with width of 0.2 mm which are alternately formed by 0.7 mm. Enamel lines are connected to both ends of the second choke-type bias supply strip 24, and a bias voltage is applied from a power source.

Two types of Gunn diode oscillators are produced, in one of which the interval between the strip conductor 5 and the end of the auxiliary board 14 is 1.5 mm, that is, a distance between the strip conductor 5 and the varactor diode 25 is 2.43 mm, and in the other of which the interval between the strip conductor 5 and the end of the auxiliary board 14 is 3.0 mm, that is, a distance between the strip conductor 5 and the varactor diode 25 is 3.93 mm and larger than 1.

Regarding these Gunn diode oscillators, the result of measuring the oscillation frequency and the oscillation output in the case of variously changing a bias voltage of the varactor diode 25 is shown in Table 1.

TABLE 1

| NO | Interval between strip conductor and auxiliary board | Bias voltage (V) | Oscillation frequency (GHz) | Oscillation output (dBm) |
|---|---|---|---|---|
| 1 | 1.5 mm | 0 | 76.32 | 14.0 |
| 2 | 1.5 | 5 | 76.42 | 14.0 |
| 3 | 1.5 | 10 | 76.62 | 13.5 |
| 4 | 3.0 | 0 | 76.32 | 14.5 |
| 5 | 3.0 | 5 | 76.33 | 14.5 |
| 6 | 3.0 | 10 | 76.35 | 14.5 |

As apparent from Table 1, in the case where the interval between the strip conductor 5 and the end of the auxiliary board 14 is 1.5 mm, it is possible to control the oscillation frequency and the oscillation output by changing a bias voltage, whereas in the case where the interval between the strip conductor 5 and the end of the auxiliary board 14 is 3.0 mm, it is approximately impossible to control the oscillation frequency and the oscillation output. As a result, it is found to be desirable to set a distance between the strip conductor 5 and the varactor diode 25 to $\lambda$ or below.

Figure 34:
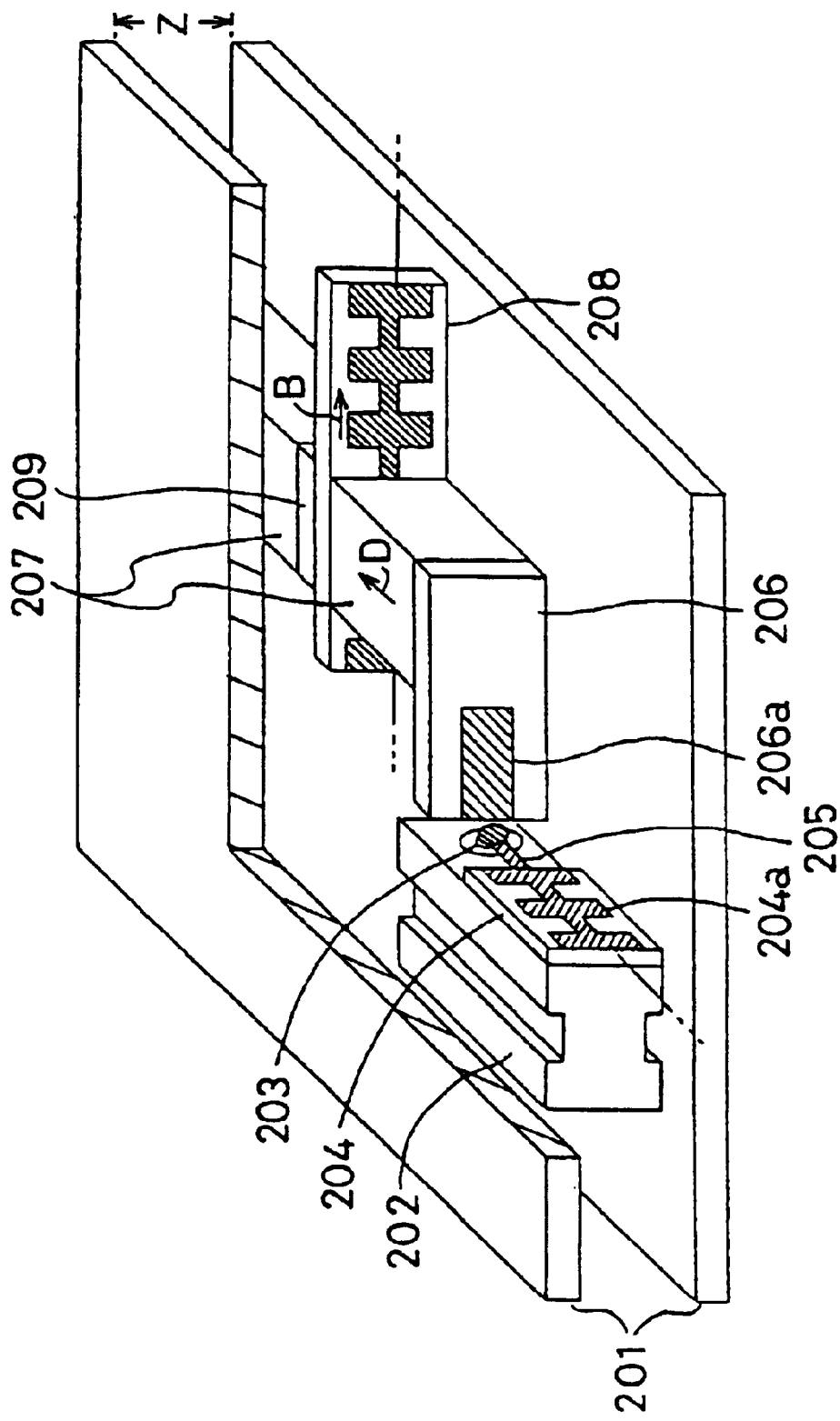
FIG. 34 is a perspective view of the inside of a conventional NRD guide type of Gunn diode oscillator.
Figure 35:
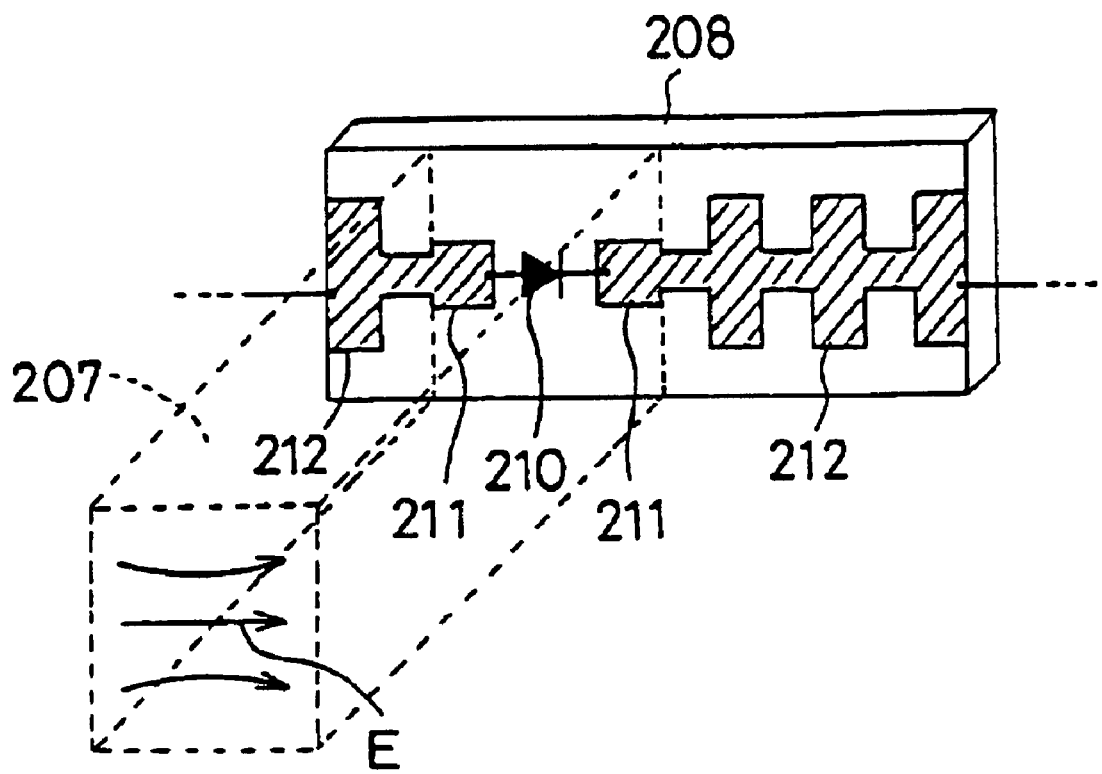
FIG. 35 is a perspective view of a conventional wiring board on which a varactor diode is disposed.

Moreover, as comparison examples, a conventional type of Gunn diode oscillator as shown in FIGS. 34 and 35 is produced so as to be the same as the above example except the modulation circuit board 20 of the invention, and a conventional type of Gunn diode oscillator with a metal strip resonator 6 is also produced. Then, a bias voltage of the varactor diode 2S is changed among 0V, 5V and 10V, and the oscillation frequency and the oscillation output are measured. As a result, in both the cases, the oscillation frequency is almost constant at 76.32–76.33 GHz, and the oscillation output is about 10.0 dBm. In the conventional oscillators, the oscillation frequency is hardly modulated, and the oscillation output is low, so that it is difficult to practically use them.

A high-frequency diode oscillator or a fifth embodiment of the invention will be explained below. FIGS. 11, 12A, 12B, 13A and 13B show a NRD guide type of high-frequency diode oscillator of the invention. The fifth embodiment is similar to the first embodiment, and like elements will be denoted by like reference numerals.

Figure 12A:
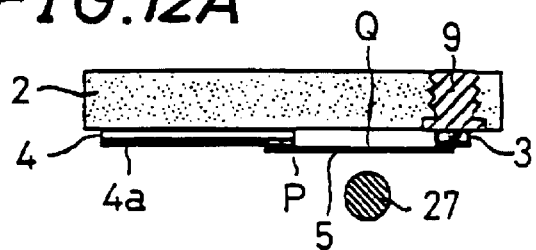
FIGS. 12A and 12B show a high-frequency diode oscillator of the invention.
Figure 12B:
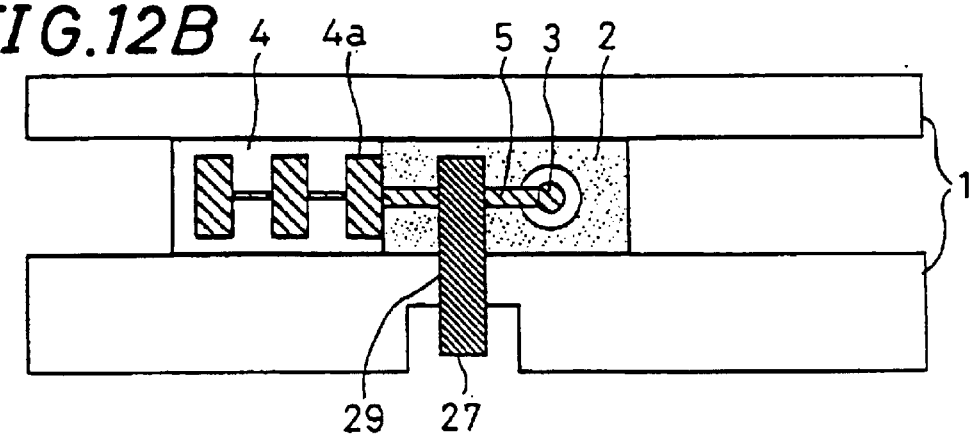

Regarding two kinds of high-frequency diode oscillators of the Invention, plan views and cross-section views of a frequency regulating member and the periphery thereof are shown in FIGS. 12A, 12B; 13A, 13B, respectively. As shown in FIGS. 12A and 12B, on one of parallel plate conductors 1, a through hole 29 which locates in the vicinity of a strip conductor 5 and passes through in the thickness direction, and a column-like frequency regulating member 27 which is inserted into the through hole 29, protruded through a surface on the side between the parallel plate conductors 1 and disposed in proximity to the strip conductor 5 to be electromagnetically coupled thereto are disposed. In this case, it is possible to insert the frequency regulating member 27 from outside the parallel plate conductors 1 and regulate the position thereof.

Figure 13A:
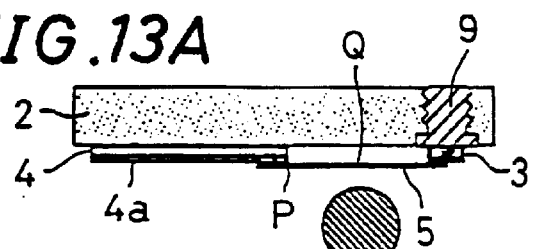
FIGS. 13A and 13B show a high-frequency diode oscillator of the invention.
Figure 13B:
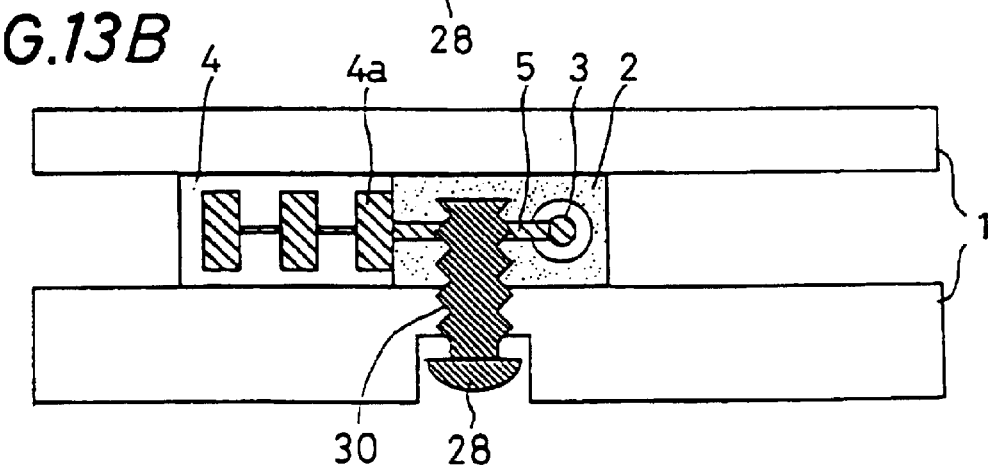

Further, in the embodiment as shown in FIGS. 13A and 13B, by cutting threads in a through hole 30 and spirally inserting a screw-like frequency regulating member 28 into the through hole, it is possible to finely regulate the protrusion length of the frequency regulating member 28 by rotation of the screw, and it is possible to control the oscillation frequency more finely.

In these embodiments, by forming a portion of the frequency regulating member 27, 28 protruded into the high-frequency diode oscillator, into a tapered shape, it is possible to more finely control. Further, it is possible to prepare a plurality of protrusions with various shapes and use in accordance with desired characteristics. For example, in order to allow control in various ways regarding the change width of the oscillation frequency, the change rate of the oscillation frequency, Q characteristics and so on, plural kinds of frequency regulating members 27, 28 may be used. A plurality of frequency regulating members 27, 28 may be disposed at positions in proximity to the strip conductor 5. For example, it is possible to dispose a member with large section area and a member with small section area, thereby roughly controlling the frequency by the member with large section area and finely controlling the frequency by the member with small section area.

Furthermore, it may be possible to dispose through holes which are opposed to each other on both the pair of parallel plate conductors 1, 1 and insert one frequency regulating member 27, 28 into the through holes, otherwise dispose through holes which are not opposed to each other on both the parallel plate conductors 1, 1 and insert regulating members 27, 28 one by one into the through holes. Although the explained frequency regulating member 27 is a column in the above embodiment, it can be not only a column but also a prism such as a triangular prism or a quadrangular prism, a cone, a pyramid, a shape with hemispheric protrusion end, and so on. Further, it may be possible to form the section shape of the frequency regulating member 27, 28 into a convex, an inverted letter T and so on, and dispose a trap for limiting the protrusion length on one end. Otherwise, it may be possible to make the inside of the frequency regulating member 27, 28 hollow to reduce the weight and cost, or it may be possible to make the frequency regulating member 27, 28 with plural kinds of materials.

As a material of the frequency regulating member 27, 28, dielectric materials such as cordierite (2MgO·2Al$_2$O$_3$·5SiO$_2$) ceramics or alumina (Al$_2$O$_3$) ceramics, or metals such as Cu, Al, Fe or SUS (stainless steel) are desirable. The above dielectric materials make low dielectric losses to high-frequency signals, and the above metals are excellent in processibility.

By thus placing the frequency regulating member 27, 28 in proximity to the strip conductor 5 and regulating the protrusion length of the frequency regulating member 27, 28, that is, the length of electromagnetic coupling, it is possible to change the coupling capacity or degree of electromagnetic coupling between the strip conductor 5 and the frequency regulating member 27, 28. As a result, it is possible to finely regulate the substantial resonator length of a resonator composed of the choke-type bias supply strip 4a and the strip conductor 5. For example, it is possible to set the electric resonator length of the strip conductor 5 slightly larger than approximately $\{(\frac{3}{4}+n)\}\lambda$, and thereby decrease the oscillation frequency.

It is preferable to set the distance between the frequency regulating member 27, 28 and the strip conductor 5 to $\lambda/4$ or below. In the case where the oscillation frequency is about 77 GHz, it is desirable to set the distance to 0.05–2.0 mm. In the case of below 0.05 mm, the frequency regulating member 27, 28 is likely to contact the strip conductor 5, whereas in the case of above 2.0 mm, the frequency regulating member 27, 28 is hard to be electromagnetically coupled with the strip conductor 5, and it is difficult to control the oscillation frequency.

Furthermore, instead of regulating the distance between the frequency regulating member 27, 28 and the strip conductor 5, by regulating the area of a surface of the frequency regulating member 27, 28 opposed to the strip conductor 5, it is possible to control the oscillation frequency. In the case where the area of the opposed surface is small, fine control is allowed and the frequency modulative width is small. In the case where the area of the opposed surface is large, relatively rough control is allowed and the frequency modulative width is large. It is preferable that the area of the opposed surface is 0.5–3.0 mm$^2$. In the case of below 0.5 mm$^2$, it is difficult to control the oscillation frequency, whereas in the case of over 3.0 mm$^2$, the frequency regulating member 27, 28 is electromagnetically coupled with the dielectric strip 6, which becomes large to an unignorable extent.

In this manner, the invention has such a configuration that the choke-type bias supply strip and the strip conductor function as a resonator which determines the oscillation frequency of a high-frequency diode, and when the frequency regulating member is disposed in proximity to the strip conductor to be electromagnetically coupled thereto, it is possible to finely regulate the position of the frequency regulating member 27, 28 with ease and reproducibility. With this, it is possible to finely regulate the substantial resonator length of the resonator. As a result, it is possible to finely regulate the oscillation frequency with reproducibility. Further, by downsizing the frequency regulating member and enabling fine regulation of the position thereof, it is possible to downsize the whole high-frequency diode oscillator.

Examples 5 and 6 of the invention will be explained below.

EXAMPLES 5 AND 6

The NRD guide type of Gunn diode oscillator as shown in FIG. 11 is configured in the following manner. The example 5 as shown in FIGS. 11, 12A and 12B is basically configured in the same manner as example 1. Example 6 as shown in FIGS. 11, 13A and 13B is basically configured in the same manner as example 1.

As shown in FIGS. 12A, 12B; 13A, 13B, at a position opposed to and separated 2.0 mm from a middle point Q between the end of the upper conductor of the Gunn diode device 3 (the side end of the strip conductor 5) and a connecting point P between the wiring board 4 and the strip conductor 5, a through hole 30 with diameter of 2.0 mm is formed on one of the parallel plate conductors 1. In this state, the oscillation frequency is 76.387 GHz. Then, a column-like screw made of SUS with diameter of 2.0 mm is spirally inserted into the through hole 30 as the frequency regulating member 28, and protruded 1.5 mm through the inside surface of the parallel plate conductor 1. In this state, the area of the frequency regulating member 28 opposed to the strip conductor 5 is approximately 1.0 mm$^2$, and the oscillation frequency is 76.612 GHz, that is, the oscillation frequency is changed by 225 MHz. Further, by regulating the protrusion length of the frequency regulating member 28, it is possible to control the oscillation frequency with reproducibility. Also in example 5 as shown in FIGS. 12A and 12B and example 6 as shown in FIGS. 13A and 13B, desirable experimental results can be obtained as in example 1.

Figure 14:
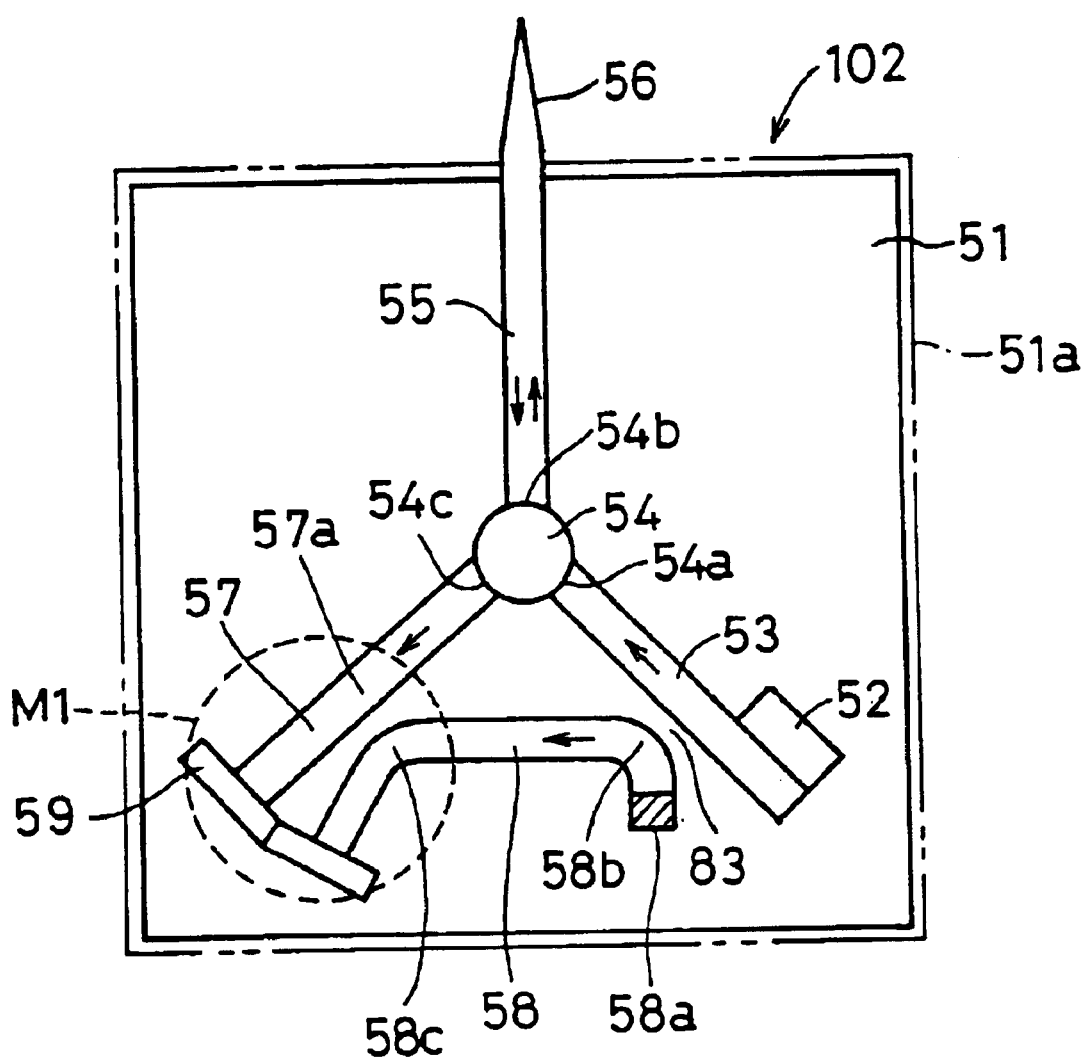
FIG. 14 shows a millimeter-wave radar module 102, 102b of the invention, which is a plan view of an embodiment in which a transmission antenna and a reception antenna are integrated.
Figure 15:
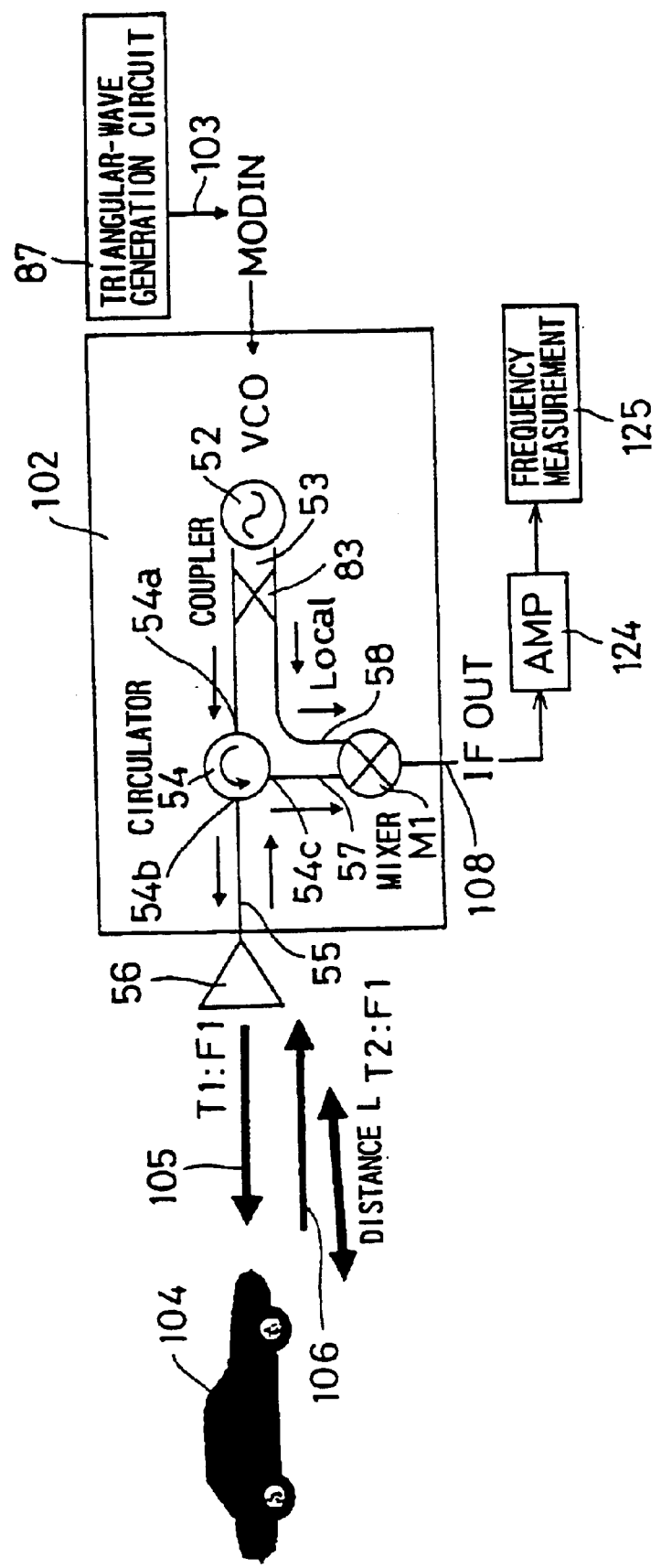
FIG. 15 is a view showing the millimeter-wave radar module 102, 102b of the invention.
Figure 16:
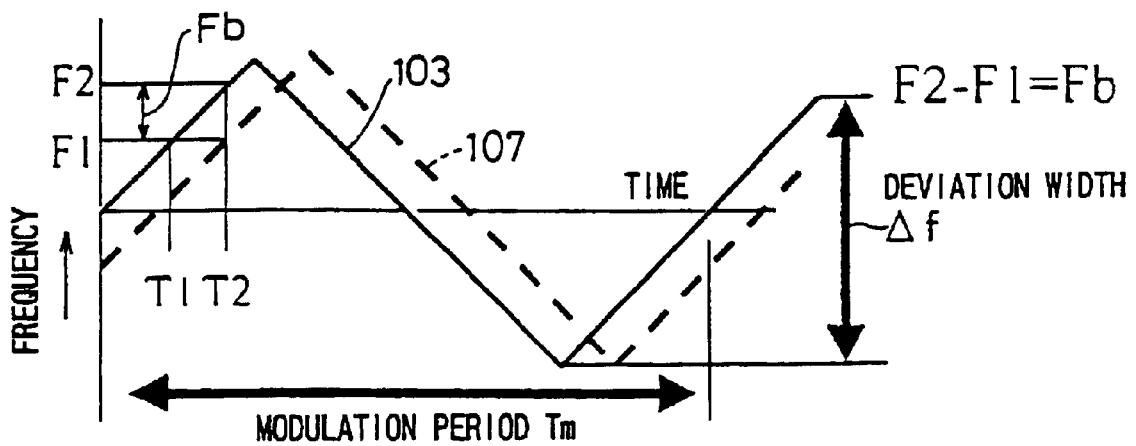
FIG. 16 is a view showing the millimeter-wave radar module 102, 102b of the invention.
Figure 17:
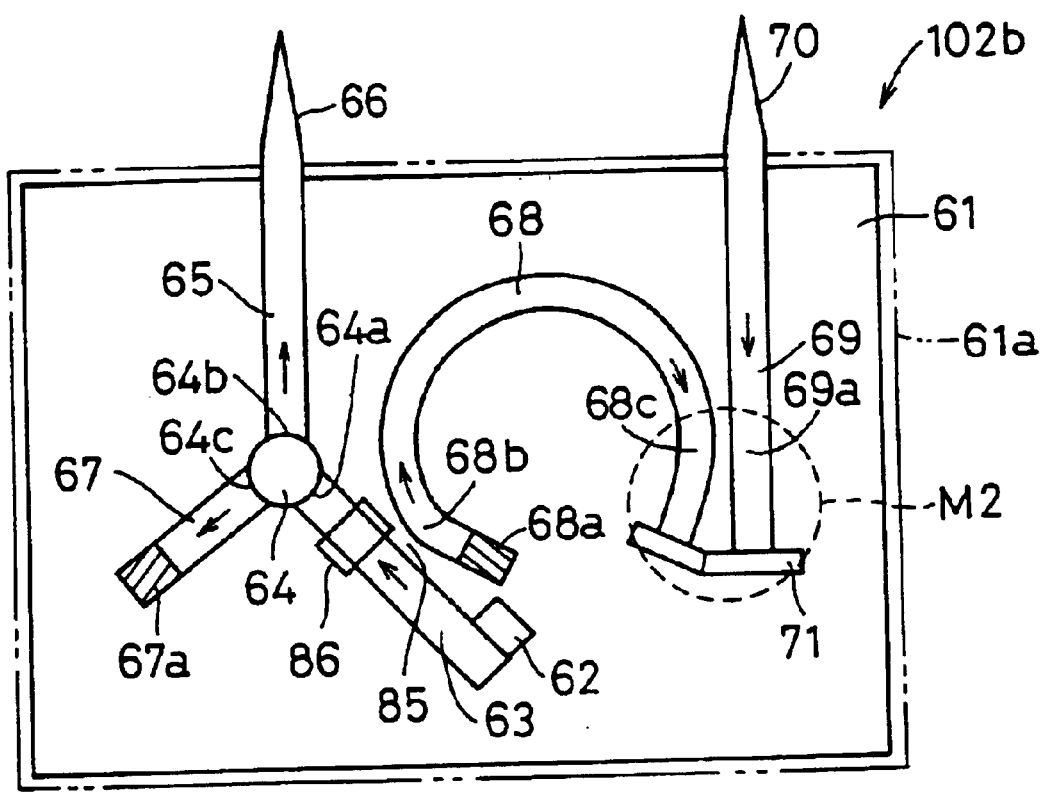
FIG. 17 shows a millimeter-wave radar module 102, 102b of the invention, which is a plan view of another embodiment in which a transmission antenna and a reception antenna are separated.

Subsequently, a millimeter-wave radar module 102, 102b as a millimeter-wave transmission/reception apparatus of the invention will be explained below. FIGS. 14–18 show the millimeter-wave radar module 102, 102b of the invention. FIG. 14 is a plan view of an embodiment in which a transmission antenna and a reception antenna are integrated, and FIG. 17 is a plan view of another embodiment in which a transmission antenna and a reception antenna are separated.

In FIG. 14, reference numeral 51 denotes one of parallel plate conductors of the invention (the other conductor 51a is shown by a phantom line), and reference numeral 52 denotes a voltage control type of millimeter-wave signal oscillator VCO disposed to one end of a first dielectric strip 53, that is, a high-frequency diode oscillator of the invention. The high-frequency diode oscillator periodically controls a bias voltage of a variable capacitance diode (a varactor diode) disposed in the vicinity of a high-frequency diode of the first dielectric strip 53 so that a bias voltage applying direction coincides with an electric field direction of millimeter-wave signals, and changes into triangular waves, sine waves or the like, thereby outputting as frequency-modulated millimeter-wave signals for transmission. That is to say, the bias voltage applying direction of the varactor diode coincides with the electric field direction of LSM$_{01}$ mode of millimeter-wave signals propagating in the first dielectric strip 53. With this, by electromagnetically coupling millimeter-wave signals and the varactor diode, and controlling the bias voltage to change the capacitance of the varactor diode, it is possible to control the frequency of millimeter-wave signals. In specific, millimeter-wave signals are partially reflected at the varactor diode, and return toward a Gunn diode, which is a high-frequency diode. The reflection signals change in accordance with change of capacitance of the varactor diode, and the oscillation frequency changes.

Reference numeral 53 denotes a first dielectric strip which propagates transmission millimeter-wave signals obtained by modulating millimeter-wave signals outputted from the Gunn diode functioning as a high-frequency diode. Reference numeral 54 denotes a circulator which has an input end 54*a*, an input/output end 54*b* and an output end 54*c* respectively connected to the first, third and fourth dielectric strips 53, 55 and 57 and has a ferrite disk. Reference numeral 55 denotes a third dielectric strip connected to the input/output end 54*b* of the circulator 54, which propagates millimeter-wave signals and has a transmission/reception antenna 56 at the front end. Reference numeral 56 denotes a transmission/reception antenna made by forming the front end of the third dielectric strip 55 into a tapered shape.

Further, reference numeral 57 denotes a fourth dielectric strip which propagates reception waves received by the transmission/reception antenna 56, propagated through the third dielectric strip 55 and outputted from the output end 54*c* of the circulator 54, toward a mixer 59. Reference numeral 58 denotes a second dielectric strip disposed in proximity to the first dielectric strip 53 so that one end 58*b* thereof is electromagnetically coupled with the first dielectric strip 53, which propagates part of millimeter-wave signals toward the mixer 59.

Reference numeral 58*a* denotes a nonreflective terminator disposed to one end of the second dielectric strip 58 on the opposite side to the mixer 59. In FIG. 14, M1 represents a mixer which, by proximately placing a mid-portion 58*c* of the second dielectric strip 58 and a mid-portion 57*a* of the fourth dielectric strip and electromagnetically coupling with each other, mixes part of millimeter-wave signals and reception waves and generates intermediate-frequency signals. In the case of proximately placing the second dielectric strip 58 and the fourth dielectric strip 57, it is possible to electromagnetically couple with each other by forming at least one of the second dielectric strip 58 and the fourth dielectric strip 57 (for example, 58*c* in FIG. 14) into a curved shape like an arc.

These parts 52–59 are disposed between the parallel plate conductors 51, 51*a* disposed at an interval equal to or less than one half of the wavelength of millimeter-wave signals.

The millimeter-wave radar module 102 of FIG. 14 is the one of FMCW (frequency modulation continuous waves) system, and the principle of operation of the FMCW system is as follows. As shown in FIG. 15, input signals whose change of voltage amplitude over time becomes triangular waves 103 of FIG. 16 are inputted from a triangular-wave generating circuit 87 to a MODIN terminal for inputting modulation signals of the millimeter-wave signal oscillator (VCO) 52, carrier waves are frequency-modulated at the VCO 52 by using the signals 103 as modulation waves, and the deviation of output frequency of the VCO 52 is caused to deviate so as to become the triangular waves 103 as shown in FIG. 16. Then, in the case where a target 104 exists in front of the transmission/reception antenna 56 when output signals (transmission waves) 105 are radiated from the transmission/reception antenna 56, reflection waves (reception waves) 106 are returned with a time lag of twice the propagation speed of electromagnetic waves, and received at the transmission/reception antenna 56. At this moment, to a IFOUT terminal 108 on the output side of the mixer 59, the frequency difference between the transmission waves 105 of transmission frequency F1 and reception waves 106 of reception frequency F2 which are the triangular waves 107, that is, Fb1=F2–F1 is outputted.

By analyzing frequency components such as the output frequency of the IFOUT terminal 108, it is possible to obtain a distance based on the following formula:

$$Fif = 4R \cdot fm \cdot \Delta f / c \qquad (1)$$

wherein Fif: IF (intermediate frequency) output frequency,

R: distance, fm (=1/Tm): modulation frequency, $\Delta f$: frequency deviation width, and c: speed of light.

Thus, in the millimeter-wave radar module 102 of the invention as shown in FIG. 14 which works as a millimeter-wave transmission/reception apparatus, transmission loss of millimeter-wave signals and the isolation property are improved in a higher-frequency band and wider bandwidth. As a result, the millimeter-wave radar module 102 is capable of increasing a detection distance when applied to a millimeter-wave radar.

The varactor diode as a variable capacitance diode can be disposed so as to be spatially electromagnetically coupled with a propagation path of high-frequency signals in another embodiment of the invention, instead of being interposed in the first dielectric strip 53, that is, disposed on a propagation path of high-frequency signals as shown in FIG. 16. For example, a configuration of disposing a metal strip resonator between a high-frequency diode and a first dielectric strip and placing a varactor diode in proximity to a metal strip line in a state where a bias voltage applying direction coincides with an electric field direction of high-frequency signals is allowed. Further, a configuration of directly placing a varactor diode in proximity to a high-frequency diode in a state where a bias voltage applying direction coincides with an electric field direction of high-frequency signals, and a configuration of placing a varactor diode in a choke-type bias supply strip of a high-frequency diode are allowed.

Further, another embodiment of a millimeter-wave radar module of the invention is the one of FIG. 17 that a transmission antenna 66 and a reception antenna 70 are separated. In FIG. 17, reference numeral 61 denotes one of a pair of parallel plate conductors of the invention (the other 61*a* is shown by a phantom line), and reference numeral 62 denotes a voltage control type of millimeter-wave signal oscillator, that is, a high-frequency diode oscillator of the invention which is disposed to one end of a first dielectric strip 63. The high-frequency diode oscillator periodically controls a bias voltage of a variable capacitance diode disposed in the vicinity of a high-frequency diode of the first dielectric strip 63 so that a bias voltage applying direction coincides with an electric field direction of millimeter-wave signals, and changes into triangular waves, sine waves or the like, thereby outputting as frequency-modulated transmission millimeter-wave signals.

Reference numeral 63 denotes a first dielectric strip which propagates transmission millimeter-wave signals obtained by frequency-modulating millimeter-wave signals outputted from the high-frequency diode. Reference numeral 64 denotes a circulator formed of a ferrite disk, which has an input end 64*a*, an input/output end 64*b* and an output end 64*c* connected to first, third and fifth dielectric strips 63, 65 and 67, respectively. Reference numeral 65 denotes a third dielectric strip connected to the input/output end 64*b* of the circulator 64 to propagate millimeter-wave signals and is provided with a transmission antenna 66 at the front end thereof. Reference numeral 66 denotes a transmission antenna disposed by forming the front end of the third dielectric strip 65 into a tapered shape. Reference numeral 67 denotes a fifth dielectric strip which is connected to the output end 64c of the circulator 64 and provided with a nonreflective terminator 67a for attenuating transmission millimeter-wave signals at the front end thereof.

Further, reference numeral 68 denotes a second dielectric strip which is disposed in proximity to the first dielectric strip 63 so that one end thereof is electromagnetically coupled with the first dielectric strip, thereby propagating part of millimeter-wave signals toward a mixer 71.

Figure 18:
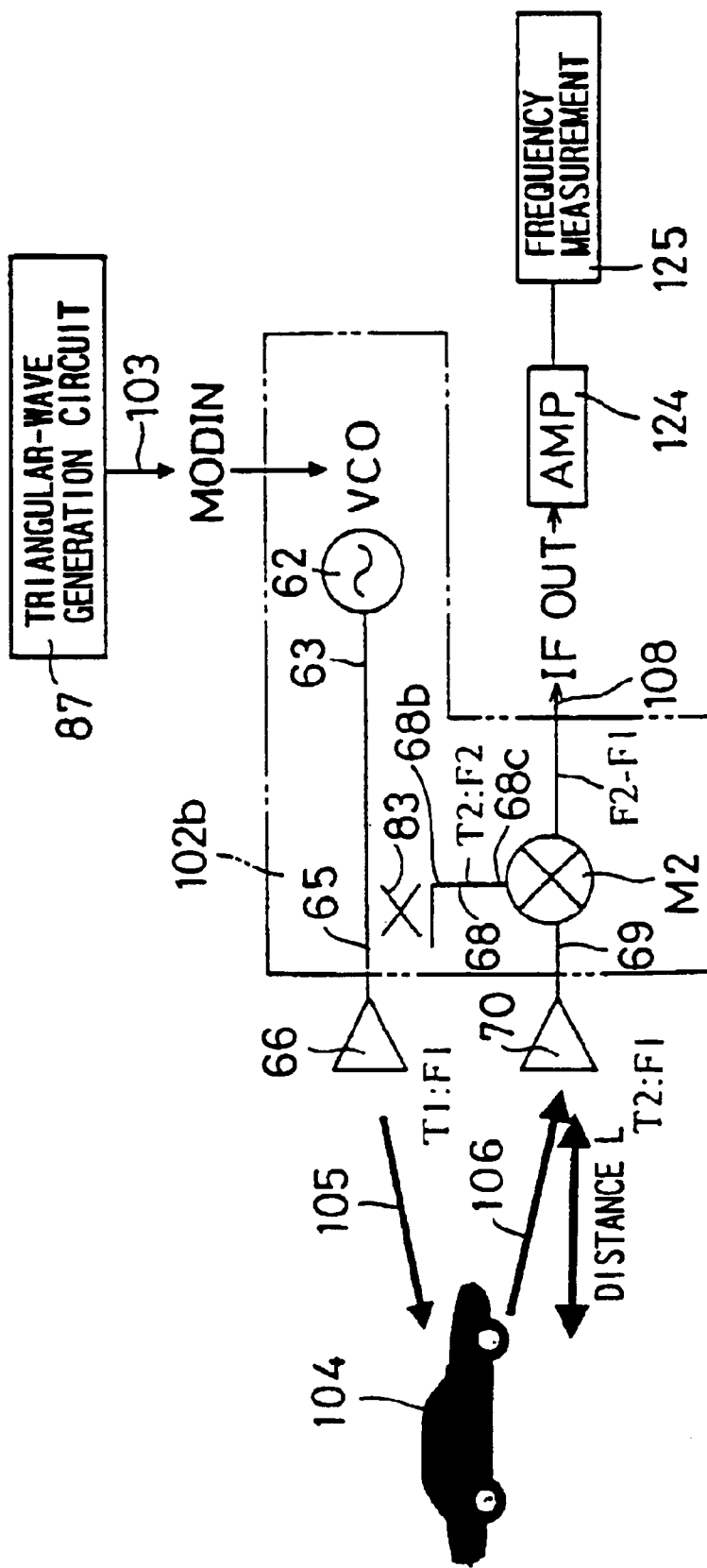
FIG. 18 is a view showing the millimeter-wave radar module 102, 102b of the invention.

Further, reference numeral 68a denotes a nonreflective terminator disposed to the other end of the second dielectric strip 68 on the opposite side to the mixer 71, and reference numeral 69 denotes a fourth dielectric strip which propagates reception waves received by the reception antenna 70 toward the mixer 71. Moreover, M2 represents a mixer section which, by proximately placing a mid-portion 68c of the second dielectric strip 68 and a mid-portion 69a of the fourth dielectric strip 69 and electromagnetically coupling with each other, mixes part of millimeter-wave signals and reception waves, and generates intermediate-frequency signals. An example as shown in FIG. 18 includes a millimeter-wave radar module as shown in FIG. 17 in which the transmission antenna 66 and the reception antenna 70 are separated. This example has the same function as the example as shown in FIGS. 15 and 16.

In a millimeter-wave radar module 102b as shown in FIG. 17, transmission loss of millimeter-wave signals and isolation characteristics are improved in a higher-frequency band and a wider bandwidth, and transmission millimeter-wave signals would not enter into the mixer via the circulator, with the result that noise of reception signals is decreased, and a detection distance is increased. Therefore, the millimeter-wave radar module can further increase a detection distance of a millimeter-wave radar.

In the millimeter-wave radar modules 102, 102b as shown in FIGS. 14–18, the intervals between the parallel plate conductors 51, 51a; 61, 61a are equal to or less than one half of the wavelength of millimeter-wave signals in the air at a used frequency.

Figure 19:
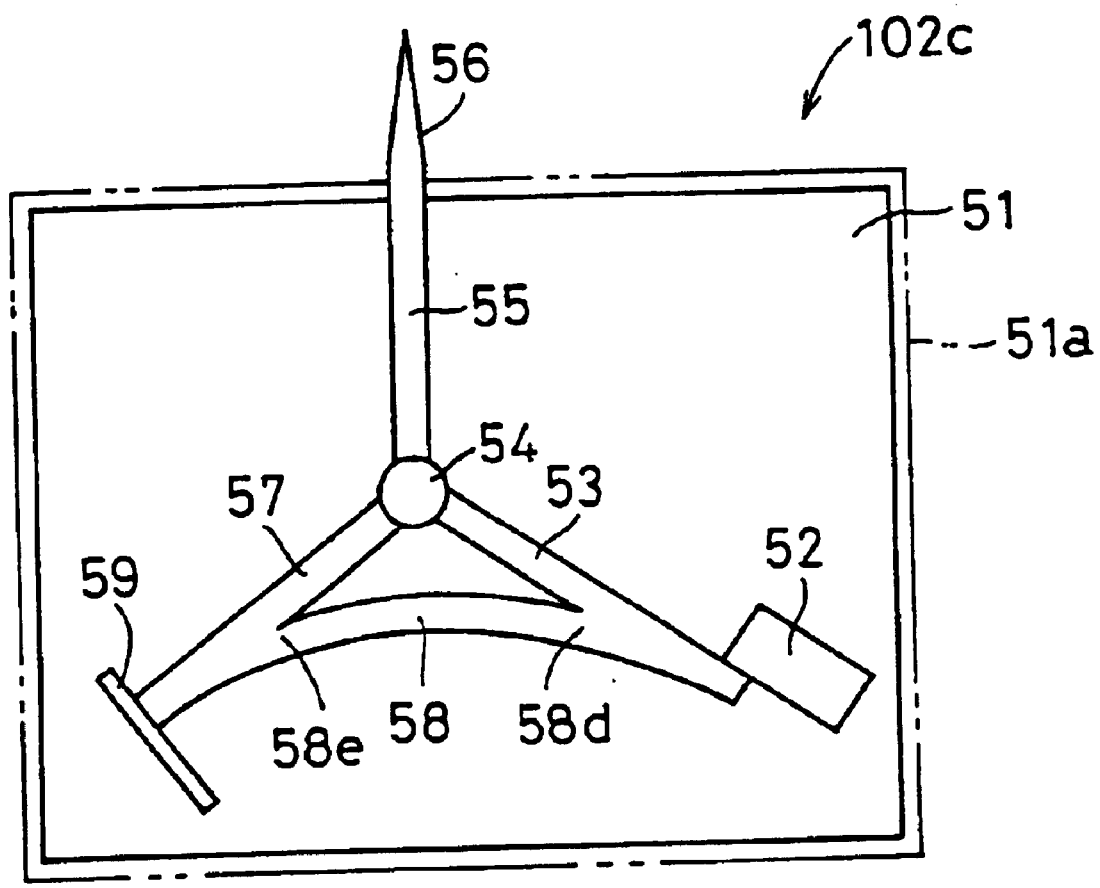
FIG. 19 is a simplified plan view of a millimeter-wave radar module 102c of another embodiment of the invention.

FIG. 19 is a simplified plan view of a millimeter-wave radar module 102c of still another embodiment of the invention. The embodiment of FIG. 19 is similar to the embodiment of FIGS. 14–16, and like elements will be denoted by like reference numerals. What should be noted in the embodiment is that ends 58d and 58e of a second dielectric strip 59 are joined to first and fourth dielectric strips 53 and 57 in the form of tangent. In a configuration of joining the first dielectric strip 53 and the end 58d of the second dielectric strip 58, the first dielectric strip 53 is linearly configured, the end 58d of the second dielectric strip 58 is configured so as to form a tangent as an arc having the radius of curvature r, and the radius of curvature r is a value equal to or more than a wavelength λ of millimeter-wave signals. Further, in a configuration of joining the end 58d of the second dielectric strip 58 and the fourth dielectric strip 57, the end 58e of the second dielectric strip 58 is joined to the straight fourth dielectric strip 57 by contacting as an arc having the radius of curvature r. The radius of curvature r is selected so as to be equal to or more than the wavelength λ of millimeter-wave signals as mentioned before, whereby a configuration of equally branching millimeter-wave signals is embodied.

Still another embodiment of the invention may have a configuration of joining the end 58d the second dielectric strip 58 as shown in FIG. 19 and, instead of joining the other end 58e, placing a mid-portion 58c of the second dielectric strip 58 in proximity to the fourth dielectric strip 57 as shown in FIG. 14. Still another embodiment of the invention may have a configuration of joining the end 58e of the second dielectric strip 58 of FIG. 19 as shown in FIG. 19 and placing a mid-portion 58b of the second dielectric strip 58 in proximity to the first dielectric strip 53 as shown in FIG. 14.

Figure 20A:
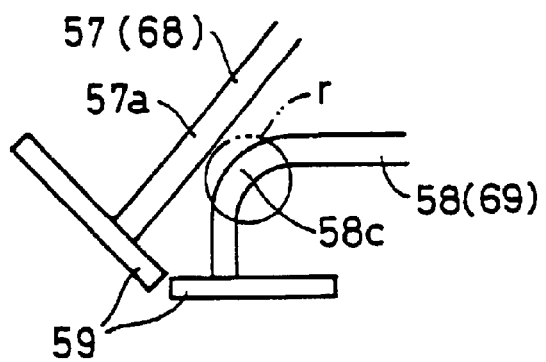
FIGS. 20A–20C are simplified plan views showing configurations of proximately placing mid-portions 58c and 57a of second and fourth dielectric strips 58 and 57 in the embodiment as shown in FIGS. 14–16.
Figure 20B:
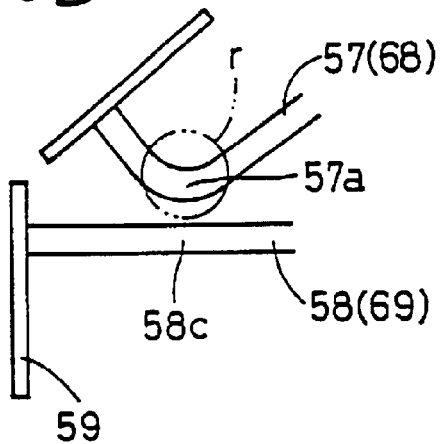
Figure 20C:
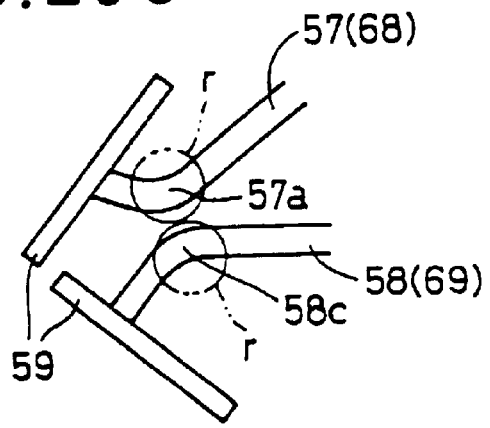

FIGS. 20A–20C are simplified plan views showing a configuration of proximately placing mid-portions 58c and 57a of second and fourth dielectric strips 58 and 57 in the embodiment as shown in FIGS. 14–16. In FIG. 20A, a fourth dielectric strip 57 is straight, and the mid-portion 58c of the second dielectric strip 58 has the radius of curvature r like mentioned before. In FIG. 20B, the mid-portion 58c of the second dielectric strip 58 is straight, and the mid-portion 57a of the fourth dielectric strip 57 is formed like an arc which has the radius of curvature r as mentioned before. In FIG. 20C, both the mid-portions 58c and 57a of the second and fourth dielectric strips 58 and 57 are formed like an arc having the radius of curvature r. Other portions are configured in the same manner as the embodiment of FIGS. 14–16.

In still another embodiment of the invention, the respective configurations of FIGS. 20A–20C may be embodied in the same manner, regarding an end 58e of the second dielectric strip 58 in FIG. 19.

Figure 21A:
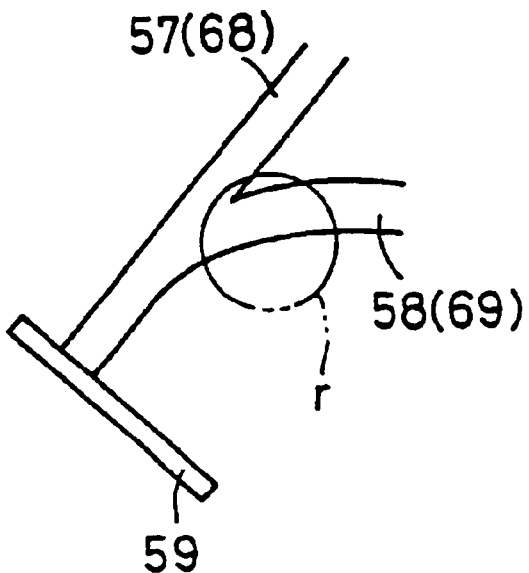
FIGS. 21A and 21B are simplified plan views of parts of respective other embodiments of the invention.
Figure 21B:
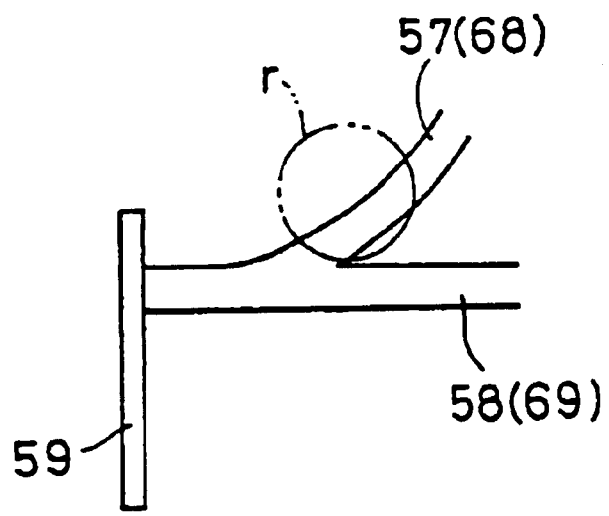

FIGS. 21A and 21B are simplified plan views of part of still another embodiments of the invention. The respective embodiments as shown in FIGS. 21A and 21B are similar to the embodiment of FIGS. 14–16, and like elements will be denoted by like reference numerals. In specific, in these embodiments, in FIG. 21A, a second dielectric strip 58 contacts a straight fourth dielectric strip 57 by forming an arc which has the radius of curvature r as mentioned before. In FIG. 21B, a fourth dielectric strip 57 contacts a straight second dielectric strip 58 by forming an arc which has the radius of curvature r. Thus, in FIGS. 21A and 21B, the second and fourth dielectric strips 58 and 57 are joined to each other.

Figure 22:
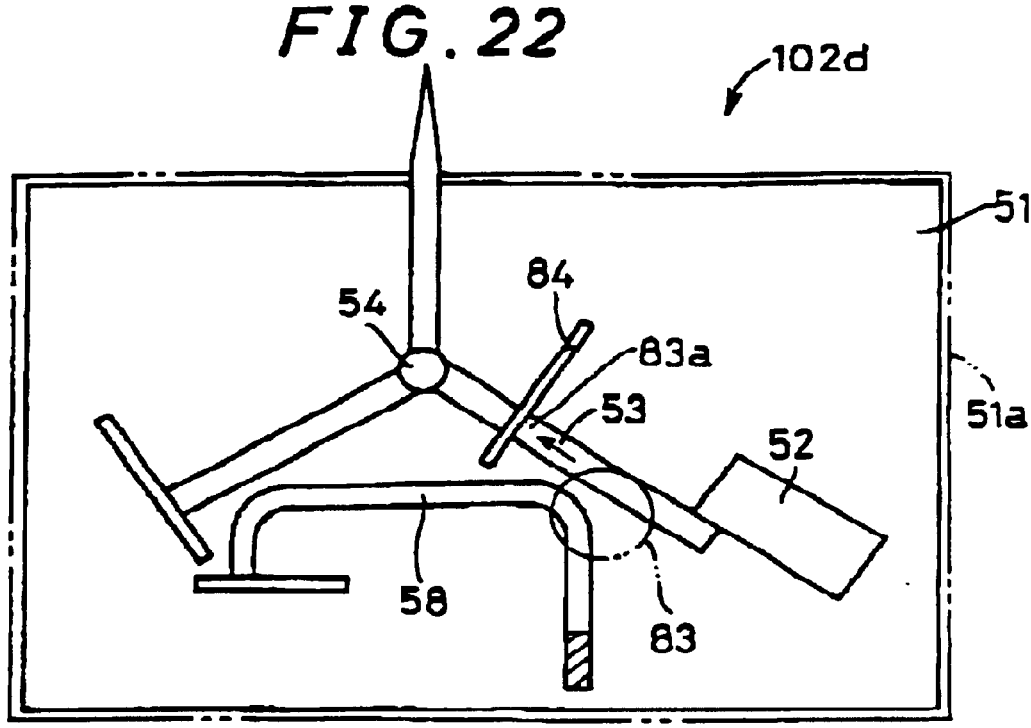
FIG. 22 is a simplified plan view of still another embodiment of the invention.

FIG. 22 is a simplified plan view of still another embodiment of the invention. This embodiment is similar to the embodiment of FIGS. 14–16, and like elements will be denoted by like reference numerals. In a millimeter-wave radar module 102d, a switch 84 is interposed in the midway of a first dielectric strip 53.

Figure 23:
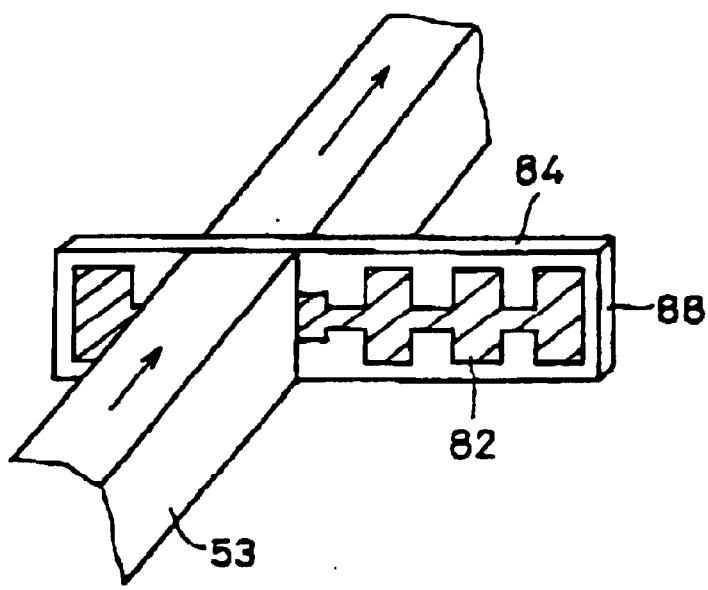
FIG. 23 is a perspective view showing a state where a switch 84 is interposed in a first dielectric strip 53 of FIG. 22.
Figure 24:
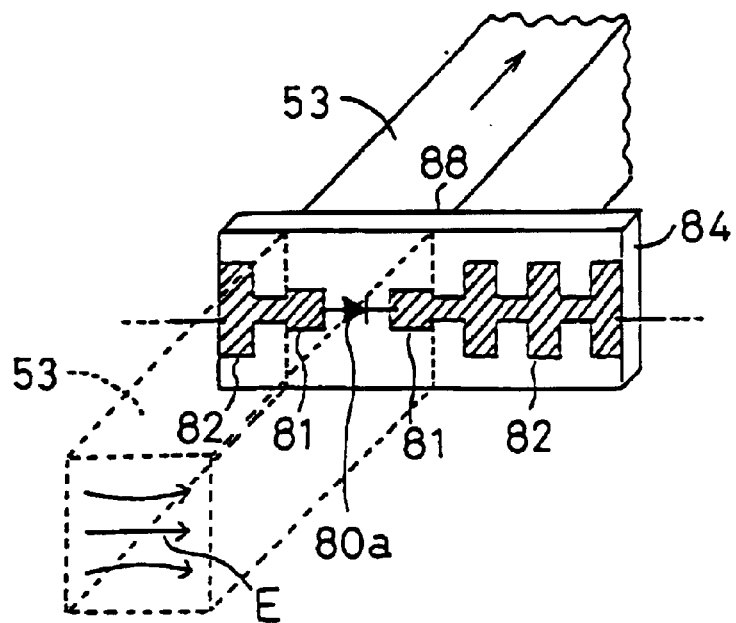
FIG. 24 is a perspective view showing the configuration of a switch 84 as shown in FIGS. 22 and 23.

FIG. 23 is a perspective view showing a state where the switch 84 is interposed in the first dielectric strip 53 as shown in FIG. 22, and FIG. 24 is a perspective view showing the configuration of the switch 84 as shown in FIGS. 22 and 23. In the embodiment of FIG. 22, it is possible to convert millimeter-wave signals into pulses by interposing the switch 84 as shown in FIGS. 23 and 24 in the midway of the first dielectric strip 53. As shown in FIG. 24, in the switch 84, a second choke-type bias supply strip 82 is formed on one main surface of a wiring board 88, and a pulse modulating diode such as a beam-lead type of PIN diode 80a is soldered in the middle thereof. On the wiring board 88, a PIN diode 80a which pulse-modulates millimeter-wave signals is disposed.

This is a configuration of interposing the switch 84 at a position 83a on the downstream side from a joint portion (a branch portion) 83 of the first dielectric strip 53 to the second dielectric strip 58 in FIG. 22. In FIG. 24, E represents an electric field direction of millimeter-wave signals, and a bias voltage applying direction of the PIN diode 80a is parallel to the electric field direction E. It is possible to pulse-modulate by on-off of a bias voltage. Further, at a connecting portion of the second choke-type bias supply strip 82 to the varactor diode 80a, a connecting electrode 81 is formed.

In the embodiment of FIGS. 22–24, the switch 84 is interposed in the first dielectric strip 53. Therefore, when the switch 84 is turned off, reflection waves from the PIN diode 80a directly returns to the oscillator 52. As a result, the oscillator 52 causes a problem of unstable oscillation intensity or frequency.

Figure 25:
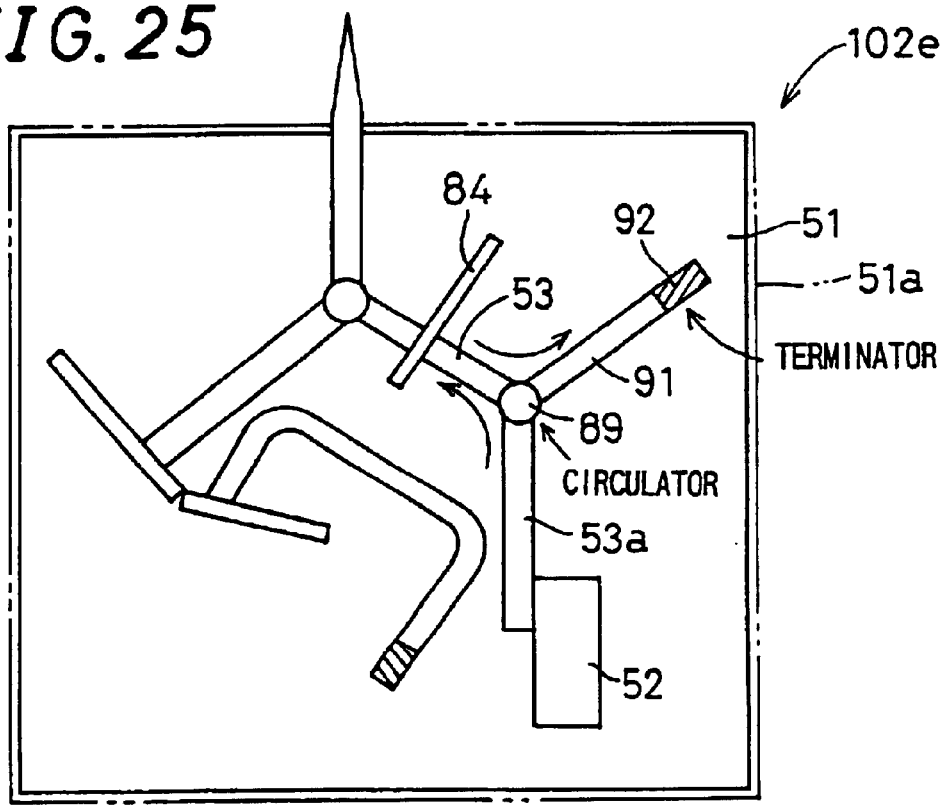
FIG. 25 is a simplified plan view showing still another embodiment of the invention.

FIG. 25 is a simplified plan view showing still another embodiment of the invention. Although this embodiment is similar to the embodiment as shown in FIGS. 22–24, it should be noted in this embodiment that the following is made in order to solve the above-mentioned problem. In order to prevent reflected waves from returning to the oscillator 52 at the time when the switch 84 is off, a circulator 89 is connected to a dielectric strip 53a at a position close to an oscillator 52 rather than a switch 84 of a first dielectric strip 53, and reflection waves at the time when the switch 84 is off are guided from a dielectric strip 91 to a terminator 92. With this, unstable oscillation intensity or frequency of the oscillator 52 due to reflection waves by the switch 84 can be prevented.

Figure 26:
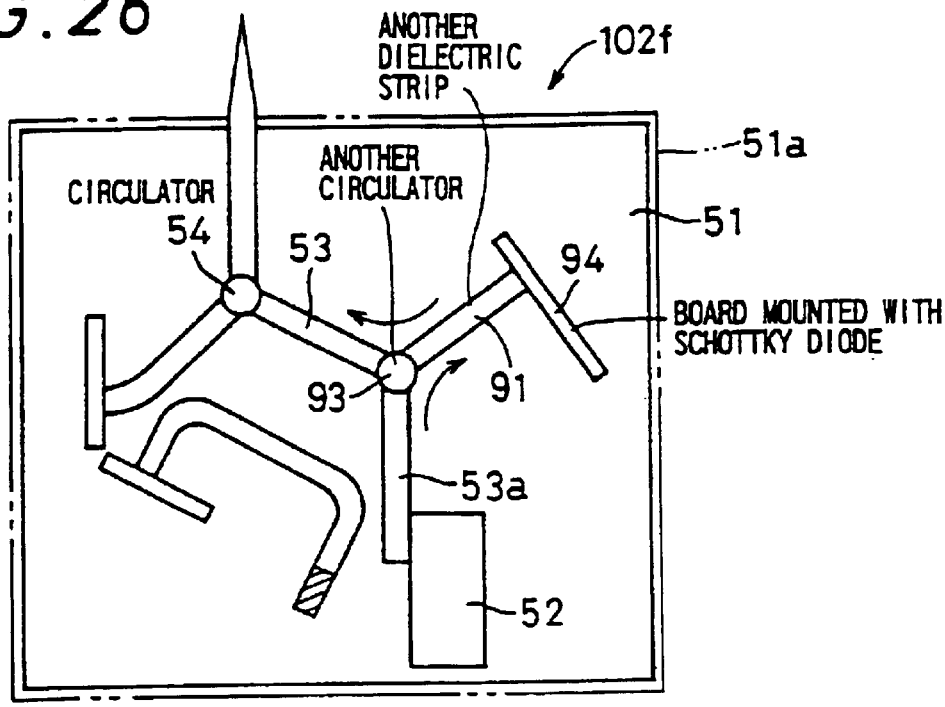
FIG. 26 is a simplified plan view of still another embodiment of the invention.

FIG. 26 is a simplified plan view of still another embodiment of the invention. This embodiment is similar to the embodiment of FIG. 25, and like elements will be denoted by like reference numerals. A circulator 93 is interposed in the midway of a first dielectric strip 53 of a millimeter-wave radar module 102f. Millimeter-wave signals from an oscillator 52 are supplied from a dielectric strip 53a to an input end of a circulator 93, and supplied from an input/output end of the circulator 93 to a switch 94 via a dielectric strip 91. The switch 94 has a wiring board on which a Schottky barrier diode of a pulse modulating diode is disposed, and has the same configuration as the switch 84. An output end of the circulator 93 is connected to the first dielectric strip 53. In this embodiment, the switch 94 may be provided with both a frequency modulating variable capacitance diode and a pulse modulating diode.

Figure 27:
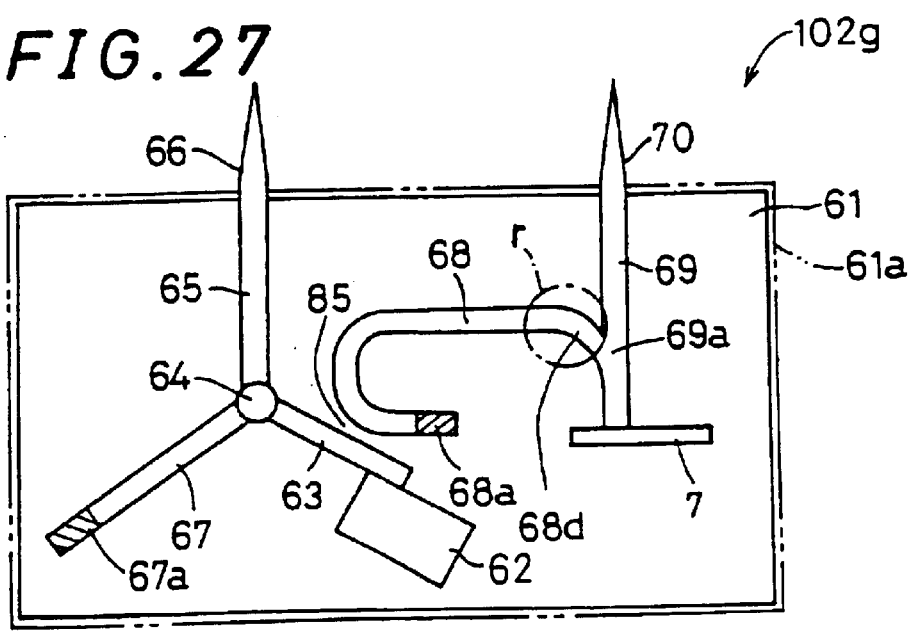
FIG. 27 is a simplified plan view of a millimeter-wave radar module 102g of still another embodiment of the invention.

FIG. 27 is a simplified plan view showing a millimeter-wave radar module 102g of still another embodiment of the invention. The millimeter-wave radar module 102g as shown in FIG. 27 is similar to the embodiment as shown in FIGS. 17 and 18, and like elements will be denoted by like reference numerals. In specific, in this embodiment, an end 68d of a second dielectric strip 68 has the radius of curvature r as mentioned before, and is joined like a tangent to a mid-portion 69a of a straight fourth dielectric strip 69.

Figure 28:
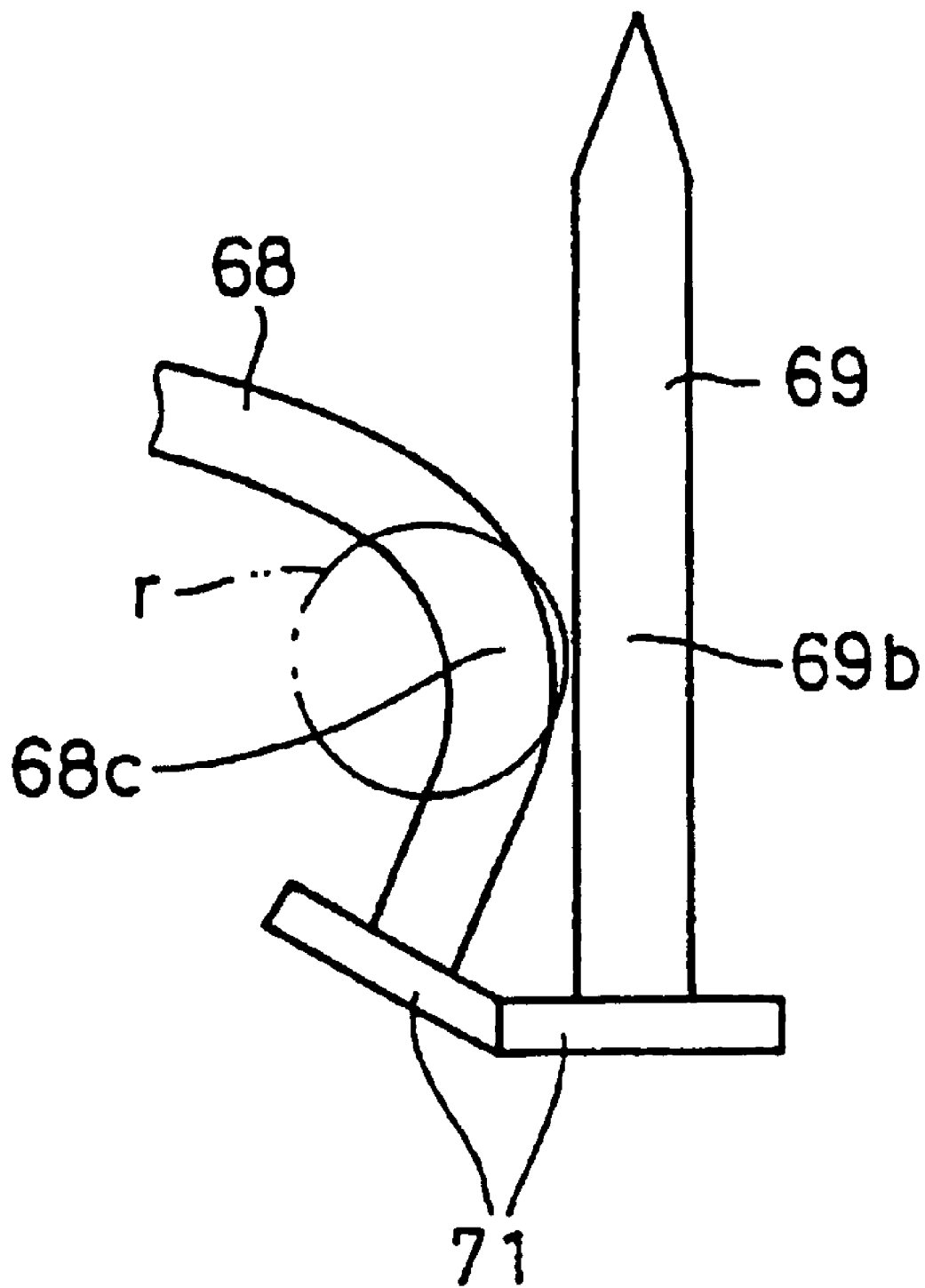
FIG. 28 is a simplified plan view of part of still another embodiment of the invention.

FIG. 28 is a simplified plan view showing part of still another embodiment of the invention. This embodiment as shown in FIG. 28 is similar to the embodiment as shown in FIG. 27, and like elements will be denoted by like reference numerals. A second dielectric strip 68 and a fourth dielectric strip 69 are proximately disposed. At least one proximate portion of proximate portions of the second dielectric strip 68 and the fourth dielectric strip 69, for example, a portion 68c is formed into a curved shape like an arc, whereby the strips are electromagnetically coupled with each other. Further, in the case of joining the second dielectric strip 68 and the fourth dielectric strip 69 of FIG. 27, a joint portion of either one, for example, a joint portion 68d is formed like an arc which has the radius of curvature r equal to or more than a wavelength λ of millimeter-wave signals, whereby millimeter-wave signals can be equally branched. These parts are disposed between parallel plate conductors 61 and 61a disposed at an interval equal to or less than one half of the wavelength of millimeter-wave signals.

In still another embodiment of the invention, a switch configured as shown in FIGS. 22 and 26 is interposed at a position 86 on the downstream side from a joint portion 85 in the midway of a first dielectric strip 63 in the embodiment of FIGS. 17 and 18, whereby it is possible to convert millimeter-wave signals into pulses. This switch 84 using a pulse modulating diode is configured and disposed in the same manner as the embodiment of FIGS. 22–24.

Figure 29:
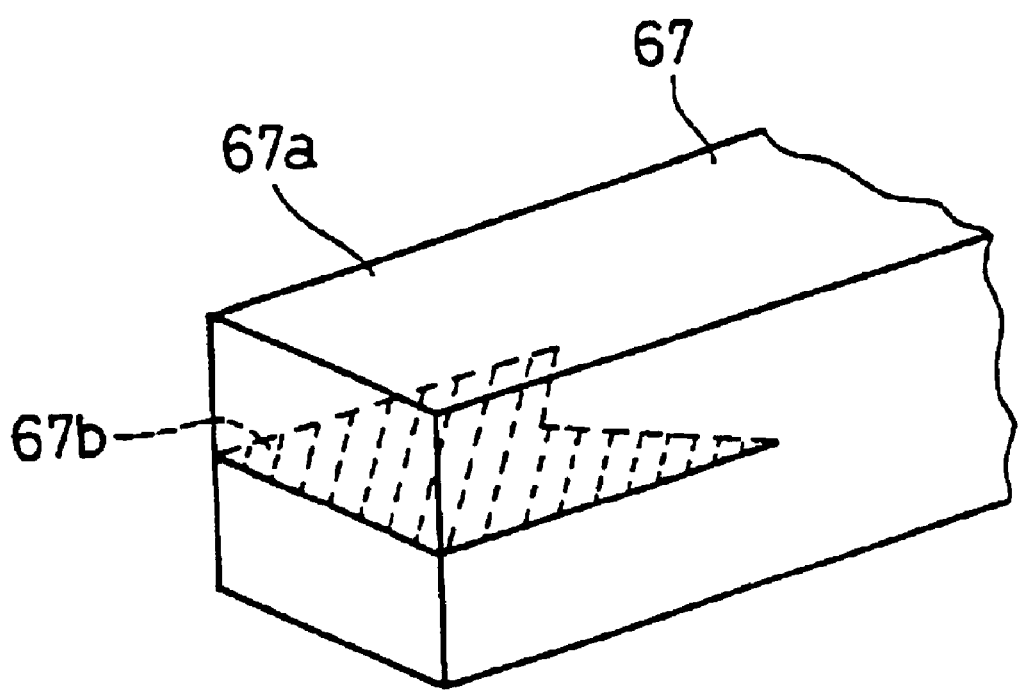
FIG. 29 is a view showing the configuration of a nonreflective terminator 67a disposed to one end of a fifth dielectric strip 67 of FIG. 17.

A nonreflective terminator 67a disposed to one end of a fifth dielectric strip 67 of FIG. 17 is configured in the following manner. As shown in FIG. 29, the fifth dielectric strip 67 is almost equally divided in two in a direction parallel to parallel plate conductors 61 and 61a (for example, a horizontal direction), and a NiCr resist film 67b or electrically conductive resin coating including electrically conductive particles such as carbon is formed on a division surface of one end of the fifth dielectric strip 67. Otherwise, the NiCr resist film 67b or electrically conductive resin coating may be formed on the side surface and end surface corresponding to the terminator 67a. The other terminators 58a, 68a and so on may be configured in the same manner.

In still another embodiment of the invention, instead of the configuration of the mixer section M2 which includes the second and fourth dielectric strips 68 and 69 and the mixer 71 in the embodiment as shown in FIGS. 17 and 18, one of FIGS. 20A–20C, 21A and 21B may be adopted. Reference numeral 57 and reference numeral 58 in FIGS. 20A–20C, 21A and 21B will be referred to as reference numeral 68 and reference numeral 69. By thus replacing the mixer section M2 as part of the configuration as shown in FIGS. 17 and 18 with the configuration of FIGS. 20A–20C, 21A or 21B, it is possible to embody the invention.

Figure 30:
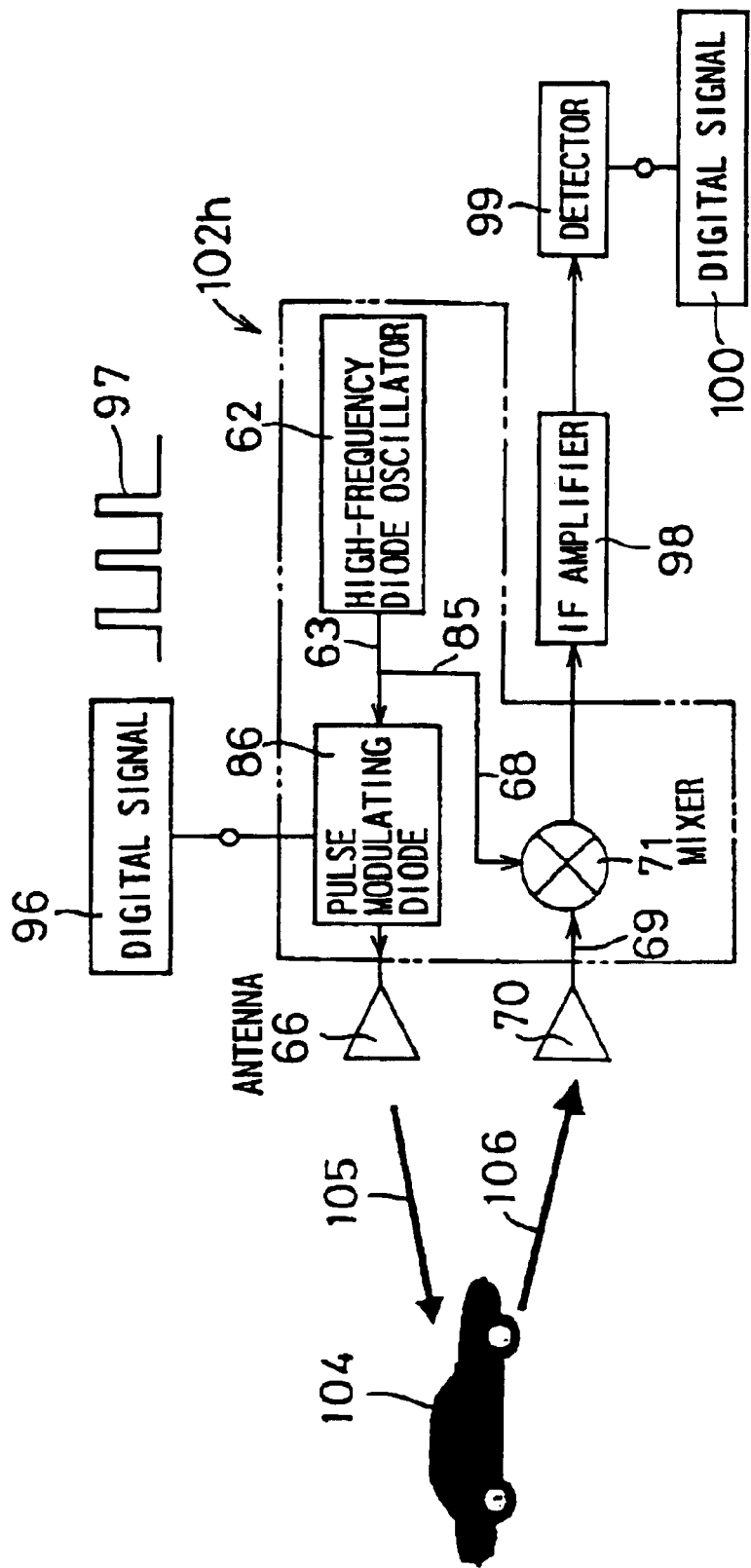
FIG. 30 is a block diagram showing the configuration of a pulse modulating millimeter-wave radar 102h of still another embodiment of the invention.
Figure 31:
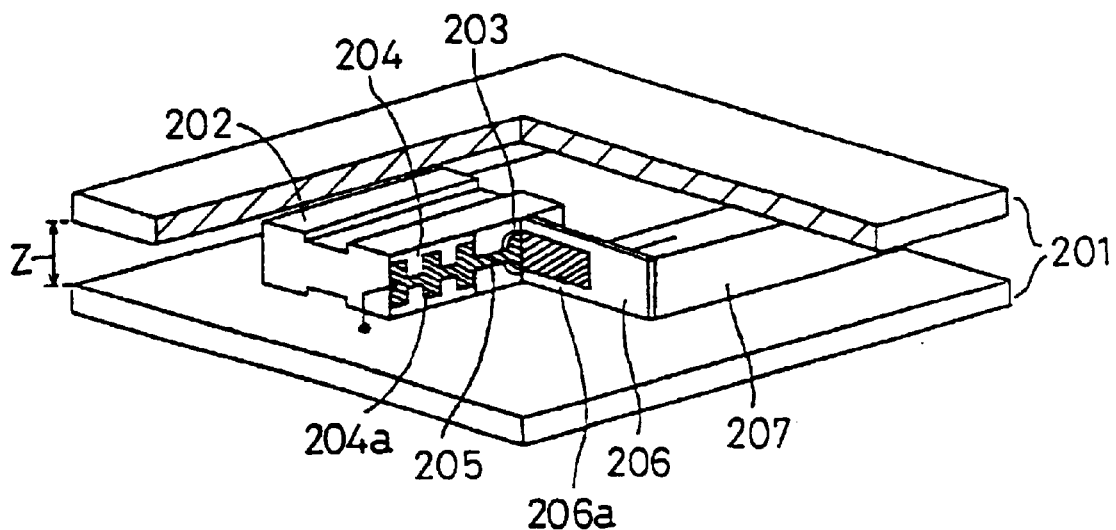
FIG. 31 is a perspective view of the inside of a conventional NRD guide type of Gunn diode oscillator in which a metal strip resonator is used.
Figure 32:
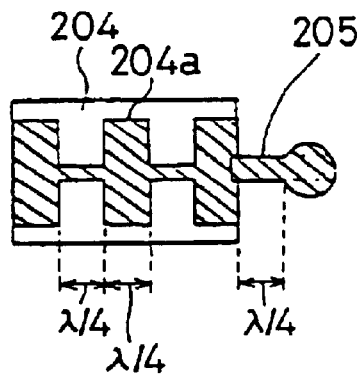
FIG. 32 is a plan view of a conventional choke-type bias supply strip and a conventional strip conductor.
Figure 33:
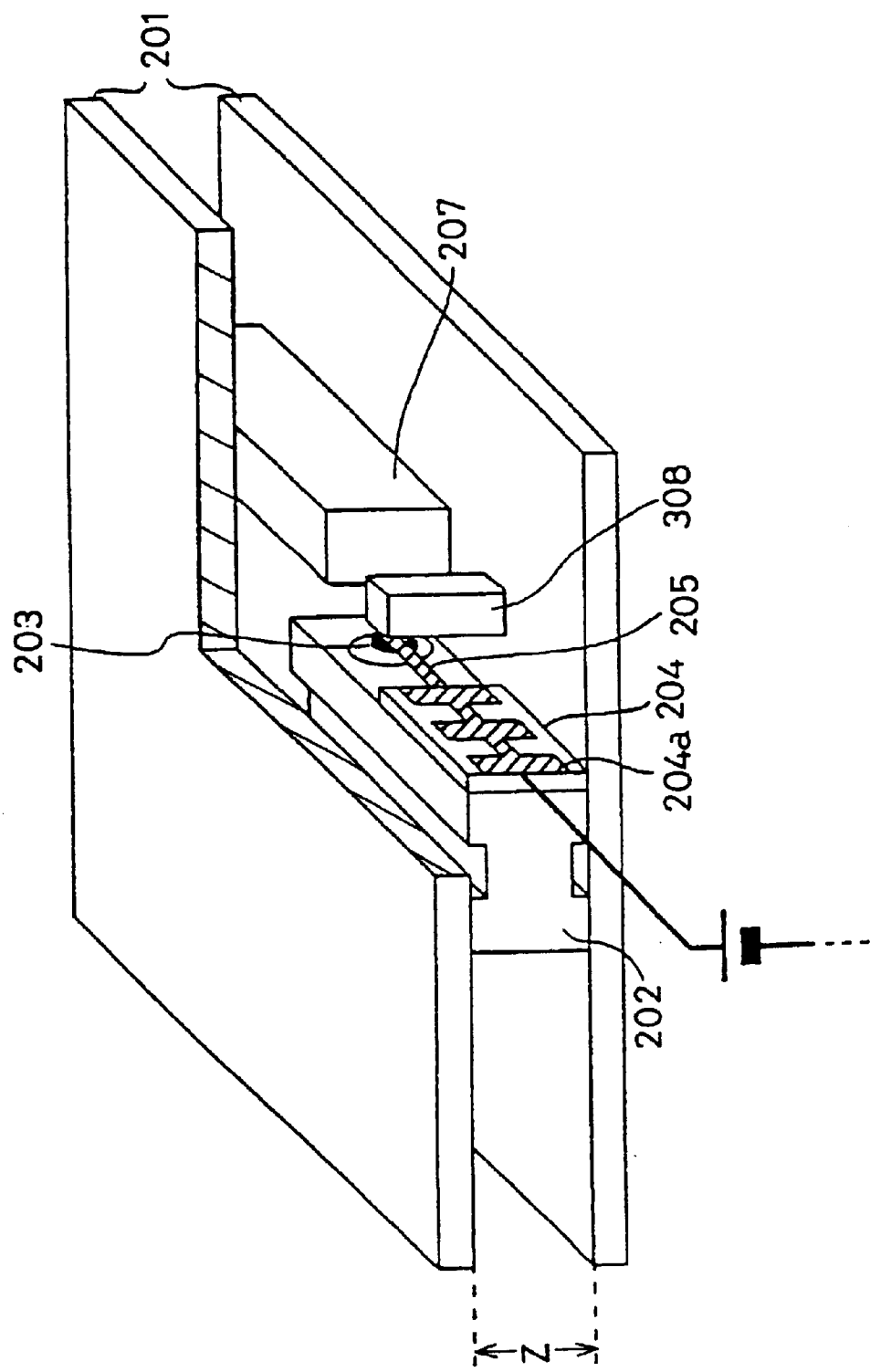
FIG. 33 is a perspective view of the inside of a conventional NRD guide type of high-frequency diode oscillator.

FIG. 30 is a block diagram showing the configuration of a pulse modulating millimeter-wave radar module 102h of still another embodiment of the invention. This radar 102h is similar to the embodiment of FIGS. 17 and 18, and like elements will be denoted by like reference numerals. A switch 86 is interposed in the midway of a dielectric strip 63, and the output of an oscillator 62 is supplied to a transmission antenna 66 and radiated. This switch 86 receives digital signals 97 from a digital signal generating circuit 96, whereby the switch 86 is on-off controlled. The switch 86 has the same configuration as shown in FIGS. 22–24. The output of a reception antenna 70 is supplied from a dielectric strip 69 to an intermediate-frequency amplifier 98 via a mixer 71 to be amplified, and supplied to a detector 99 to be detected. The output of the digital signal processing circuit 99 is supplied to a digital signal processing circuit 100 to be digital-processed. The invention can also be embodied in such a configuration.

High-frequency signals of millimeter-wave band from a high-frequency diode are modulated to pulses, whereby transmission millimeter-wave signals can be obtained. In this case, a pulse modulating diode such as a PIN diode or a Schottky barrier diode is interposed or disposed in the midway of the transmission direction of the first dielectric strip 63 so that a bias voltage applying direction coincides with an electric field direction of the high-frequency signals, and a bias voltage supplied from the circuit 96 is on-off controlled, whereby high-frequency signals are converted into pulses. In the case of interposing a pulse modulating diode in the first dielectric strip 63, the pulse modulating diode is a PIN diode configured as shown in FIG. 24.

Otherwise, in still another embodiment, another circulator is interposed in a first dielectric strip 63, another dielectric strip is connected to an input/output end of this circulator, a terminator is disposed to the front end of this dielectric strip, and a PIN diode configured as shown in FIG. 24 is interposed between this circulator and the circulator 54, 64 (FIGS. 22, 25 and 17).

Otherwise, another circulator is interposed in a first dielectric strip 63, another dielectric strip is connected to an input/output end of this circulator, and a Schottky barrier diode mounted on the wiring board 88 of FIG. 24 is installed to the front end of this dielectric strip.

The position of placing a pulse modulating diode is on the downstream side of a signal branching portion between the first dielectric strip 63 and the second dielectric strip 68.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A millimeter-wave transmitting/receiving apparatus comprising:
    parallel plate conductors disposed at an interval equal to or less than one half of wavelength of a transmission millimeter-wave signal; and
    the following parts disposed between the parallel plate conductors:
    (a) a high-frequency diode oscillator for outputting millimeter-wave signals, including:
        a metal member on which a high-frequency diode for oscillating high-frequency signals, a choke-type bias supply strip for supplying a bias voltage to the high-frequency diode, the choke-type bias supply strip comprising wide strips and narrow strips which are alternately arranged, and a strip conductor for linearly connecting the choke-type bias supply strip and the high-frequency diode are disposed, and
        a dielectric strip disposed in a vicinity of the high-frequency diode, for receiving and propagating the millimeter-wave signals,
        lengths of the wide strips and narrow strips of the choke-type bias supply strip being set to approximately $\lambda/4$ ($\lambda$ represents a wavelength of a high-frequency signal), respectively,
        a length of the strip conductor being set to approximately $\{(3/4)+\}\lambda$ (n represents an integer of 0 or more);
    (b) a first dielectric strip having one end where the high-frequency diode is disposed, for propagating a millimeter-wave signal outputted from the high-frequency diode oscillator;
    (c) a variable capacitance diode disposed so that a bias voltage applying direction coincides with an electric field direction of the millimeter-wave signal, for periodically controlling a bias voltage and thereby outputting the millimeter-wave signal as a frequency-modulated transmission millimeter-wave signal;
    (d) a second dielectric strip having one end which is disposed in proximity to or joined to a portion of the first dielectric strip on a downstream side from the variable capacitance diode in a transmitting direction of the transmission millimeter-wave signal, so as to be electromagnetically coupled with the portion;
    (e) a circulator having an input end, an input/output end and an output end,
        the other end of the first dielectric strip being coupled with the input end,
        a transmission millimeter-wave signal inputted to the input end being outputted to the input/output end,
        a reception signal inputted to the input/output end being outputted to the output end;
    (f) a third dielectric strip having one end which is coupled to the input/output end of the circulator, and another end where a transmission/reception antenna is disposed;
    (g) a fourth dielectric strip having one end which is coupled with the output end of the circulator; and
    (h) a mixer for mixing signals transmitted to the second and fourth dielectric strips, and generating intermediate-frequency signals by disposing in proximity to each other or joining a mid-portion of the second dielectric strip and a mid-portion of the fourth dielectric strip so as to be electromagnetically coupled to each other.

2. A millimeter-wave transmitting/receiving apparatus comprising:
    parallel plate conductors disposed at an interval equal to or less than one half of wavelength of a transmission millimeter-wave signal; and
    the following parts disposed between the parallel plate conductors:
    (a) a high-frequency diode oscillator for outputting millimeter-wave signals, including:
        a metal member on which a high-frequency diode for oscillating high-frequency signals, a choke-type bias supply strip for supplying a bias voltage to the high-frequency diode, the choke-type bias supply strip comprising wide strips and narrow strips which are alternately arranged, and a strip conductor for linearly connecting the choke-type bias supply strip and the high-frequency diode are disposed, and
        a dielectric strip disposed in a vicinity of the high-frequency diode, for receiving and propagating the millimeter-wave signals,
        lengths of the wide strips and narrow strips of the choke-type bias supply strip being set to approximately $\lambda/4$ ($\lambda$ represents a wavelength of a high-frequency signal), respectively,
        a length of the strip conductor being set to approximately $\{(3/4)+n\}\lambda$ (n represents an integer of 0 or more);
    (b) a first dielectric strip having one end where the high-frequency diode is disposed, for propagating a millimeter-wave signal outputted from the high-frequency diode oscillator;
    (c) a pulse modulation diode disposed to be interposed in or attached to the first dielectric strip so that a bias voltage applying direction coincides with an electric field direction of the millimeter-wave signal, for outputting a transmission millimeter-wave signal obtained by pulse-modulating the millimeter-wave, by on-off of a bias voltage;
    (d) a second dielectric strip having one end which is disposed in proximity to or joined to a portion of the first dielectric strip on an upstream side from the pulse modulation diode in a transmitting direction of the transmission millimeter-wave signal, so as to be electromagnetically coupled with the portion;
    (e) a circulator having an input end, an input/output end and an output end,
        the other end of the first dielectric strip being coupled with the input end,
        a transmission millimeter-wave signal inputted to the input end being outputted to the input/output end, a reception signal inputted to the input/output end being outputted to the output end;

(f) a third dielectric strip having one end which is coupled to the input/output end of the circulator, and another end where a transmission/reception antenna is disposed;

(g) a fourth dielectric strip having one end which is coupled with the output end of the circulator; and (h) a mixer for mixing signals transmitted to the second and fourth dielectric strips, and generating intermediate-frequency signals by disposing in proximity to each other or joining a mid-portion of the second dielectric strip and a mid-portion of the fourth dielectric strip so as to be electromagnetically coupled to each other.

3. A millimeter-wave transmitting/receiving apparatus comprising:

parallel plate conductors disposed at an interval equal to or less than one half of wavelength of a transmission millimeter-wave signal; and the following parts disposed between the parallel plate conductors:

(a) a high-frequency diode oscillator for outputting millimeter-wave signals, including:

a metal member on which a high-frequency diode for oscillating high-frequency signals, a choke-type bias supply strip for supplying a bias voltage to the high-frequency diode, the choke-type bias supply strip comprising wide strips and narrow strips which are alternately arranged, and a strip conductor for linearly connecting the choke-type bias supply strip and the high-frequency diode are disposed, and a dielectric strip disposed in a vicinity of the high-frequency diode, for receiving and propagating the millimeter-wave signals, lengths of the wide strips and narrow strips of the choke-type bias supply strip being set to approximately $\lambda/4$ ($\lambda$ represents a wavelength of a high-frequency signal), respectively, a length of the strip conductor being set to approximately $\{(3/4)+n\}\lambda$ (n represents an integer of 0 or more);

(b) a first dielectric strip having one end where the high-frequency diode is disposed, for propagating a millimeter-wave signal outputted from the high-frequency diode oscillator;

(c) a variable capacitance diode disposed so that a bias voltage applying direction coincides with an electric field direction of the millimeter-wave signal, for periodically controlling a bias voltage and thereby outputting the millimeter-wave signal as a frequency-modulated transmission millimeter-wave signal;

(d) a second dielectric strip having one end which is disposed in proximity to or joined to a portion of the first dielectric strip on a downstream side from the variable capacitance diode in a transmitting direction of the transmission millimeter-wave signal, so as to be electromagnetically coupled with the portion;

(e) a circulator having an input end, an input/output end and an output end, the other end of the first dielectric strip being coupled with the input end, a transmission millimeter-wave signal inputted to the input end being outputted to the input/output end, a reception signal inputted to the input/output end being outputted to the output end;

(f) a third dielectric strip having one end which is coupled to the input/output end of the circulator, and another end where a transmission antenna is disposed;

(g) a terminator coupled to the output end of the circulator;

(h) a fourth dielectric strip having one end where a reception antenna is disposed, for guiding a received millimeter-wave signal; and (i) a mixer for mixing signals transmitted to the second and fourth dielectric strips, and generating intermediate-frequency signals by disposing in proximity to each other or joining a mid-portion of the second dielectric strip and a mid-portion of the fourth dielectric strip so as to be electromagnetically coupled to each other.

4. A millimeter-wave transmitting/receiving apparatus comprising:

parallel plate conductors disposed at an interval equal to or less than one half of wavelength of a transmission millimeter-wave signal; and the following parts disposed between the parallel plate conductors:

(a) a high-frequency diode oscillator for outputting millimeter-wave signals, including:

a metal member on which a high-frequency diode for oscillating high-frequency signals, a choke-type bias supply strip for supplying a bias voltage to the high-frequency diode, the choke-type bias supply strip comprising wide strips and narrow strips which are alternately arranged, and a strip conductor for linearly connecting the choke-type bias supply strip and the high-frequency diode are disposed, and a dielectric strip disposed in a vicinity of the high-frequency diode, for receiving and propagating the millimeter-wave signals, lengths of the wide strips and narrow strips of the choke-type bias supply strip being set to approximately $\lambda/4$ ($\lambda$ represents a wavelength of a high-frequency signal), respectively, a length of the strip conductor being set to approximately $\{(3/4)+n\}\lambda$ (n represents an integer of 0 or more):

(b) a first dielectric strip having one end where the high-frequency diode is disposed, for propagating a millimeter-wave signal outputted from the high-frequency diode oscillator;

(c) a pulse modulation diode disposed to be interposed in or attached to the first dielectric strip so that a bias voltage applying direction coincides with an electric field direction of the millimeter-wave signal, for outputting a transmission millimeter-wave signal obtained by pulse-modulating the millimeter-wave, by on-off of a bias voltage;

(d) a second dielectric strip having one end which is disposed in proximity to or joined to a portion of the first dielectric strip on an upstream side from the pulse modulation diode in a transmitting direction of the transmission millimeter-wave signal, so as to be electromagnetically coupled with the portion;

(e) a circulator having an input end, an input/output end and an output end, the other end of the first dielectric strip being coupled with the input end, a transmission millimeter-wave signal inputted to the input end being outputted to the input/output end, a reception signal inputted to the input/output end being outputted to the output end;

(f) a third dielectric strip having one end which is coupled to the input/output end of the circulator, and another end where a transmission antenna is disposed;

(g) a terminator coupled to the output end of the circulator;

(h) a fourth dielectric strip having one end where a reception antenna is disposed, for guiding a received millimeter-wave signal; and (i) a mixer for mixing signals transmitted to the second and fourth dielectric strips, and generating intermediate-frequency signals by disposing in proximity to each other or joining a mid-portion of the second dielectric strip and a mid-portion of the fourth dielectric strip so as to be electromagnetically coupled to each other.

* * * * *